(12) United States Patent
O

(10) Patent No.: US 11,276,459 B2
(45) Date of Patent: Mar. 15, 2022

(54) MEMORY DIE INCLUDING LOCAL PROCESSOR AND GLOBAL PROCESSOR, MEMORY DEVICE, AND ELECTRONIC DEVICE

(71) Applicant: SAMSUNG ELECTRONICS CO., LTD., Suwon-si (KR)

(72) Inventor: Seongil O, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/996,434

(22) Filed: Aug. 18, 2020

(65) Prior Publication Data

US 2021/0225430 A1 Jul. 22, 2021

(30) Foreign Application Priority Data

Jan. 16, 2020 (KR) .................. 10-2020-0005896

(51) Int. Cl.
*G06F 13/00* (2006.01)
*G11C 11/4096* (2006.01)
(Continued)

(52) U.S. Cl.
CPC ...... *G11C 11/4096* (2013.01); *G06F 13/1668* (2013.01); *G11C 11/4091* (2013.01);
(Continued)

(58) Field of Classification Search
CPC ............. G11C 11/4096; G11C 11/4091; G06F 13/1668; H01L 25/0652; H01L 25/0657;
(Continued)

(56) References Cited

U.S. PATENT DOCUMENTS 8,042,082 B2 * 10/2011 Solomon ................. G06F 30/30
716/116
9,477,636 B2 * 10/2016 Walker ................ G06F 15/7821
(Continued)

OTHER PUBLICATIONS

Peng Gu et al, "iPIM: Programmable In-Memory Image Processing Accelerator Using Near-Bank Architecture", 2020, IEEE/ACM/ISCA, 47th annual, pp. 804-817 (Year: 2020).*
(Continued)

*Primary Examiner* — Viet Q Nguyen
(74) *Attorney, Agent, or Firm* — Sughrue Mion, PLLC

(57) ABSTRACT

A memory die includes a first bank including first memory cells; a second bank including second memory cells; a first local processor connected with first bank local input/output lines through which first local bank data of the first bank are transmitted, and configured to execute a first local calculation on the first local bank data; a second local processor connected with second bank local input/output lines through which second local bank data of the second bank are transmitted, and configured to execute a second local calculation on the second local bank data; and a global processor configured to control the first bank, the second bank, the first local processor, and the second local processor and to execute a global calculation on a first local calculation result of the first local calculation and a second local calculation result of the second local calculation.

16 Claims, 15 Drawing Sheets

(51) Int. Cl.
*H01L 25/065* (2006.01)
*G11C 11/4091* (2006.01)
*G06F 13/16* (2006.01)
*G06T 1/60* (2006.01)
*G10L 15/28* (2013.01)

(52) U.S. Cl.
CPC ...... *H01L 25/0652* (2013.01); *H01L 25/0657* (2013.01); *G06T 1/60* (2013.01); *G10L 15/28* (2013.01); *H01L 2225/06513* (2013.01); *H01L 2225/06541* (2013.01)

(58) Field of Classification Search
CPC . H01L 2225/06513; H01L 2225/06541; G06T 1/60; G10L 15/28
USPC ........................................................ 711/105
See application file for complete search history.

(56) References Cited

U.S. PATENT DOCUMENTS

| | | | |
|---|---|---|---|
| 9,767,028 B2* | 9/2017 | Cheng | G06F 13/42 |
| 9,947,386 B2 | 4/2018 | Arora et al. | |
| 10,331,354 B2* | 6/2019 | Yu | G06F 3/0683 |
| 10,360,034 B2* | 7/2019 | Tannenbaum | G06F 9/3012 |
| 10,592,467 B2* | 3/2020 | Ryu | G06F 15/785 |
| 10,664,438 B2* | 5/2020 | Sity | G06F 11/1016 |
| 10,768,824 B2* | 9/2020 | Yu | G11C 5/04 |
| 11,056,173 B2* | 7/2021 | O | H04L 9/0894 |
| 11,069,400 B1* | 7/2021 | O | G11C 11/4096 |
| 2006/0136681 A1* | 6/2006 | Jain | G06F 13/1673 711/154 |
| 2012/0226865 A1* | 9/2012 | Choi | G06F 13/1642 711/121 |
| 2018/0336035 A1* | 11/2018 | Choi | G06F 15/785 |
| 2019/0272100 A1 | 9/2019 | Yu et al. | |

OTHER PUBLICATIONS

Zhu et al., "A 3D-stackelogic-in-memory accelerator for application-specific data intensive computing", 2013, IEEE International 3D System Conference, (Year: 2013).*

* cited by examiner

MEMORY DIE INCLUDING LOCAL PROCESSOR AND GLOBAL PROCESSOR, MEMORY DEVICE, AND ELECTRONIC DEVICE

CROSS-REFERENCE TO RELATED APPLICATIONS

This application claims priority under 35 U.S.C. § 119 to Korean Patent Application No. 10-2020-0005896 filed on Jan. 16, 2020, in the Korean Intellectual Property Office, the disclosure of which is incorporated by reference herein in its entirety.

BACKGROUND

The inventive concept relates to a memory die including a local processor and a global processor, a memory device, and an electronic device.

A plurality of semiconductor dies may be stacked. A memory device of a three-dimensional structure may process a large amount of data at a high speed. To implement the three-dimensional structure, a through silicon via (TVS) may be used to stack a plurality of semiconductor dies. Nowadays, even though a data processing speed increases, the separation of a processor from a memory causes a latency of data that are transmitted between the processor and the memory. To solve this issue, a processing in memory (PIM) in which the processor and the memory are integrated may be used.

SUMMARY

Embodiments provide a memory die including a local processor and a global processor, a memory device, and an electronic device.

According to an exemplary embodiment, a memory die includes a first bank; a second bank; a first local processor connected to first bank local input/output lines through which first local bank data of the first bank are transmitted, and configured to execute a first local calculation on the first local bank data; a second local processor connected to second bank local input/output lines through which second local bank data of the second bank are transmitted, and configured to execute a second local calculation on the second local bank data; and a global processor configured to control the first bank, the second bank, the first local processor, and the second local processor and to execute a global calculation on a first local calculation result of the first local calculation and a second local calculation result of the second local calculation.

Provided herein is a memory die including: a first bank including first memory cells; a second bank including second memory cells; a first local processor connected to first bank local input/output lines through which first local bank data of the first bank are transmitted, the first local processor configured to execute a first local calculation on the first local bank data; a second local processor connected to second bank local input/output lines through which second local bank data of the second bank are transmitted, the second local processor configured to execute a second local calculation on the second local bank data; and a global processor configured to: control the first bank, the second bank, the first local processor, and the second local processor, and execute a global calculation on a first local calculation result of the first local calculation and a second local calculation result of the second local calculation.

Also provided herein is a memory device including: a first memory die including first banks accessible through a channel, wherein the first memory die is configured to: receive commands for the first banks from a host through the channel, and perform a data input/output with the host through the channel based on the commands; and a second memory die including: second banks accessible through the channel, local processors configured to execute local calculations on data of the second banks, respectively, and a global processor configured to: control the second banks and the local processors, and execute a global calculation on local calculation results of the local calculations.

Also provided herein is an electronic device including: a memory device including a first memory die and a second memory die, wherein the first memory die includes first banks, and wherein the second memory die includes: second banks, local processors configured to execute local calculations on data of the second banks, respectively, and a global processor configured to: control the second banks and the local processors, and execute a global calculation on local calculation results of the local calculations; and a system on chip including a memory controller configured to access one of the first memory die and the second memory die through a channel.

Also provided herein is a memory die including: a multi-die databus configured to provide communication with a host, wherein the host is external to the memory die; a global processor directly coupled to the multi-die databus, the global processor configured to: perform a video processing task as commanded by the host, and delegate a compute-intensive portion of the video processing task to a local processor; a first local bus gating circuit coupled to the multi-die databus and to a local bus; a second local bus gating circuit coupled to the local bus and a memory bank; the memory bank; the local processor coupled to: the multi-die databus via the first local bus gating circuit, and the memory bank via the second local bus gating circuit, wherein the multi-die databus, the global processor, the local bus, the first local bus gating circuit, the second local bus gating circuit and the local processor are configured to efficiently use limited bus bandwidth for high speed data processing, wherein the high speed data processing includes the video processing task.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Figure 1:
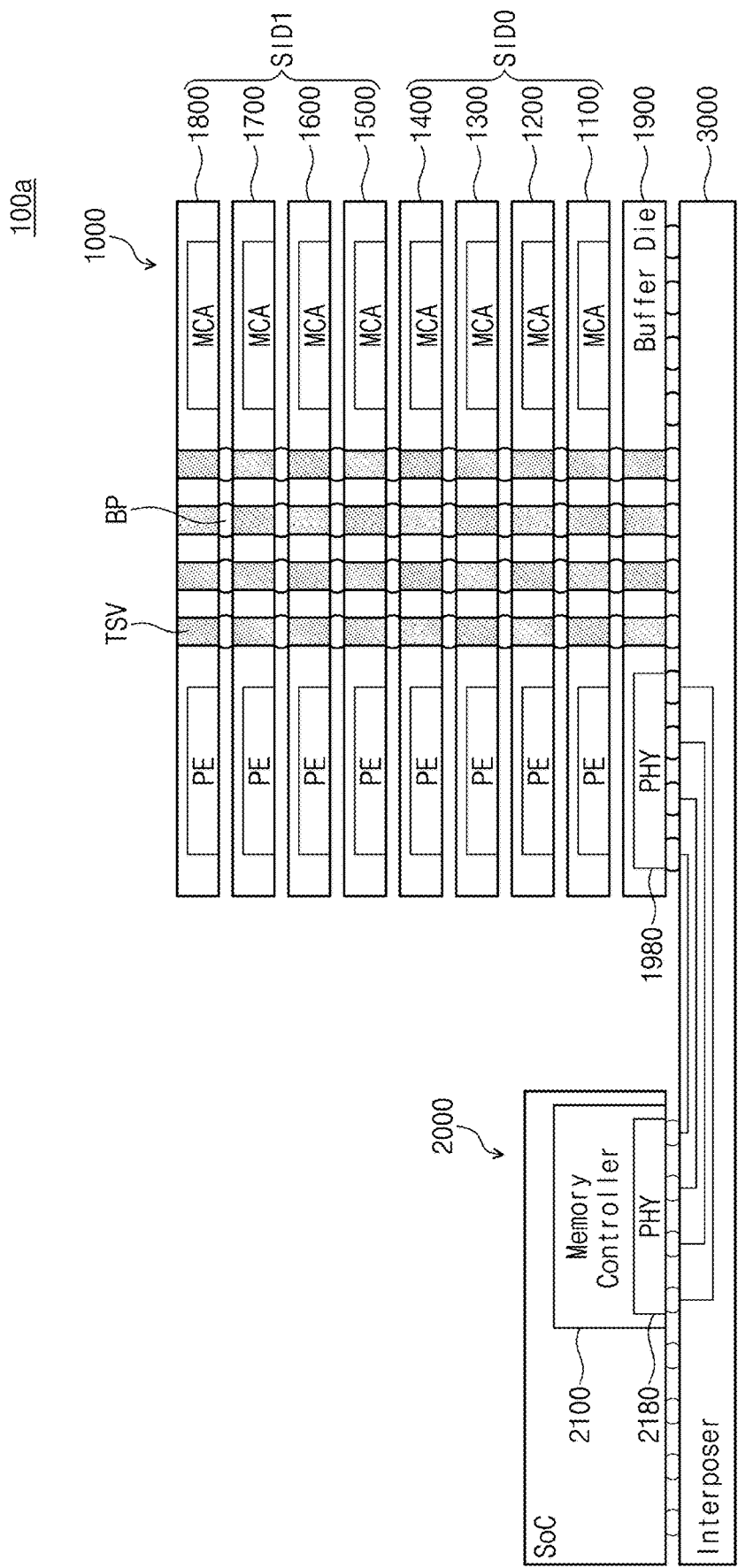
FIGS. 1 and 2 illustrate electronic devices according to embodiments of the inventive concept.

FIG. 1 illustrates an electronic device according to an embodiment. An electronic device 100a may include a memory device 1000, a system on chip (SoC) 2000, and an interposer 3000. The electronic device 100a may be also referred to as a "computing system" or an "electronic system".

The memory device 1000 may include processing in memory/processor in memory (PIM) dies 1100 to 1800 and a buffer die 1900. Each of the PIM dies 1100 to 1800 may be also referred to a "memory die", a "core die", an "FIM die", or a "slave die", and the buffer die 1900 may be also referred to as an "interface die", a "logic die", or a "master die". A die may be also referred to as a "chip." The PIM die 1100 may be stacked on the buffer die 1900, and the PIM die 1200 may be stacked on the PIM die 1100.

The memory device 1000 may have a three-dimensional memory structure in which the plurality of dies 1100 to 1900 are stacked. To stack the dies 1100 to 1900, the memory device 1000 may include through silicon vias TSVs penetrating the dies 1100 to 1900 and micro bumps BPs electrically connecting the through silicon vias TSVs. The through silicon vias TSVs and the micro bumps BPs may provide electrical and physical paths between the dies 1100 to 1900 in the memory device 1000. The number of through silicon vias TSVs and the number of micro bumps BPs are not limited to the example illustrated in FIG. 1.

The memory device 1000 may relate to the PIM or FIM and may further perform a data processing operation in addition to reading and writing data. The memory device 1000 may correspond to a computational memory device including a random access memory (RAM) and a processing element (PE) integrated in the same die. Each of the PIM dies 1100 to 1800 of the memory device 1000 may include a memory cell array MCA that is used to read and write data and include a plurality of memory cells and a processing element PE that executes a processing operation on data. For example, the PE may be also referred to as a "processor" or a "processing circuit". A stack identifier SID0 may be allocated to the PIM dies 1100 to 1400, and a stack identifier SID1 may be allocated to the PIM dies 1500 to 1800. The stack identifier SID0/SID1 may be used to identify or distinguish the plurality of PIM dies 1100 to 1800 stacked on the buffer die 1900. For example, a memory controller 2100 may access the PIM dies 1100 to 1400 or the PIM dies 1500 to 1800 by using the stack identifier SID0/SID1. The number of PIM dies 1100 to 1800 and the number of PIM dies 1100 to 1400/1500 to 1800 per stack identifier SID0/SID1 are not limited to the example illustrated in FIG. 1.

The buffer die 1900 may operate as an interface circuit between (or regarding or is associated with) the memory controller 2100 and the PIM dies 1100 to 1800. The buffer die 1900 may receive a command, data, signals, etc. transmitted from the memory controller 2100 through the interposer 3000 and may transmit the received command, data, signals, etc. to the PIM dies 1100 to 1800 through the through silicon vias TSVs and the micro bumps BPs. The buffer die 1900 may receive data output from the PIM dies 1100 to 1800 through the through silicon vias TSVs and the micro bumps BPs and may transmit the received data to the memory controller 2100 through the interposer 3000. The buffer die 1900 may include a physical layer (PHY) 1980, buffering circuits, or interface circuits that receive and amplify the above signals.

In an embodiment, the memory device 1000 may be a general-purpose dynamic random access memory (DRAM) such as DDR SDRAM (Double Data Rate Synchronous Dynamic Random Access Memory), a mobile DRAM device such as LPDDR (low power double data rate) SDRAM, a graphics DRAM device such as GDDR (Graphics Double Data Rate) SGRAM (Synchronous Graphics Random Access Memory), or a DRAM device, which provides a high capacity and a high bandwidth, such as Wide I/O, HBM (High Bandwidth Memory), HBM2, HBM3, or HMC (Hybrid Memory Cube). The system on chip 2000 may execute applications that the electronic device 100a supports by using the memory device 1000. The system on chip 2000 may be also referred to as a "host" or an "application processor (AP)". The system on chip 2000 may include the memory controller 2100 that controls the memory device 1000 and performs a data input/output with the memory device 1000. For example, the memory controller 2100 may access the memory device 1000 in a direct memory access (DMA) manner. The memory controller 2100 may include a PHY 2180 that is electrically connected to the PHY 1980 of the memory device 1000 through the interposer 3000.

The interposer 3000 may connect the system on chip 2000 and the memory device 1000. The interposer 3000 may provide physical paths that connect between the memory device 1000 and the PHY 2180 of the system on chip 2000 and are formed of conductive materials for an electrical connection. A substrate or a printed circuit board (PCB) may be used instead of the interposer 3000.

Figure 2:
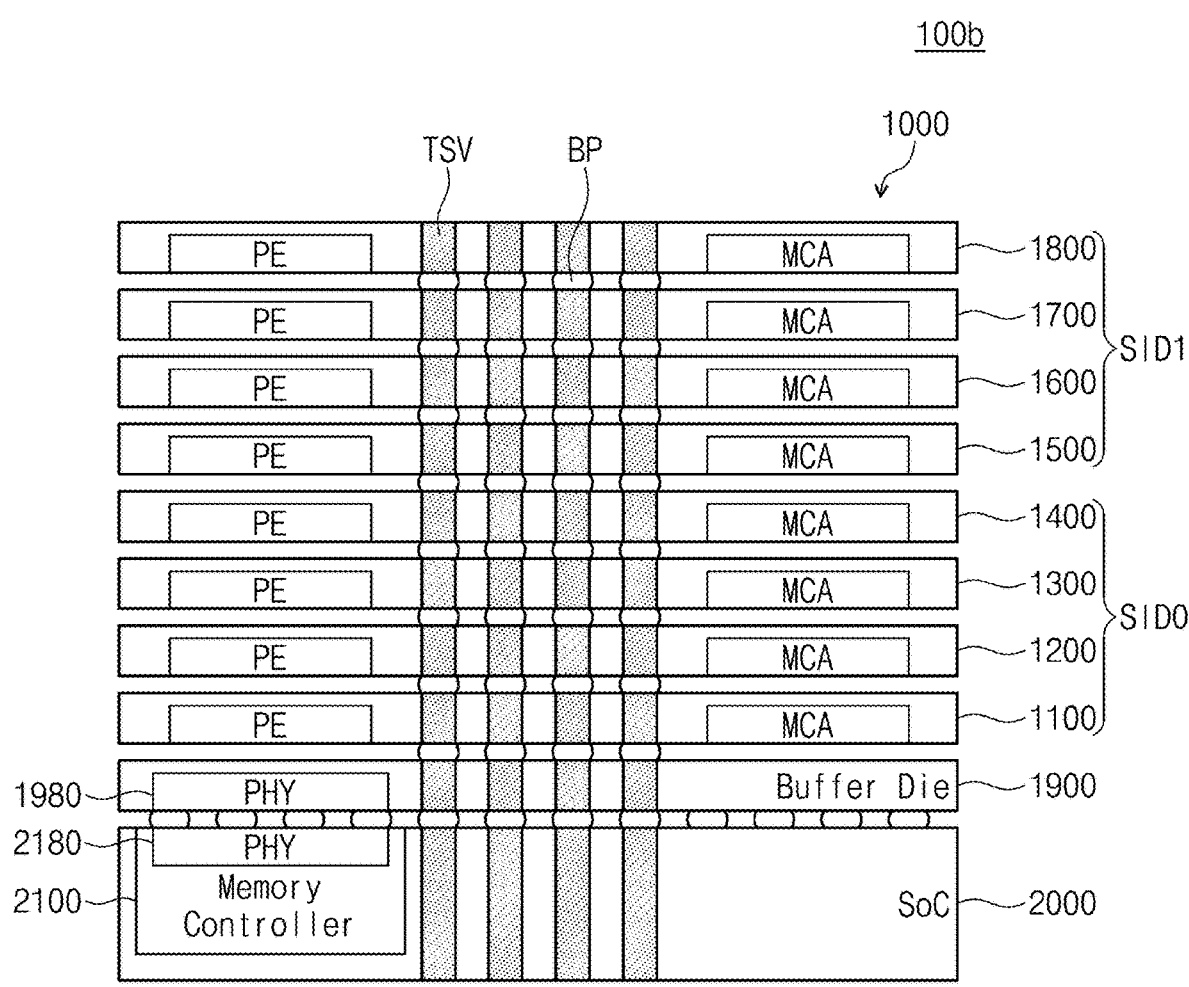

FIG. 2 illustrates an electronic device according to another embodiment of the inventive concept. An electronic device 100b may include the memory device 1000 and the system on chip 2000. The memory device 1000 and the system on chip 2000 in the electronic device 100a may be interconnected through the interposer 3000, while the memory device 1000 of the electronic device 100b may be stacked on the system on chip 2000. The system on chip 2000 may further include the through silicon vias TSVs that are used to implement an electrical connection with the memory device 1000, and the PHYs 1980 and 2180 may be electrically interconnected through the micro bumps BPs.

Figure 3:
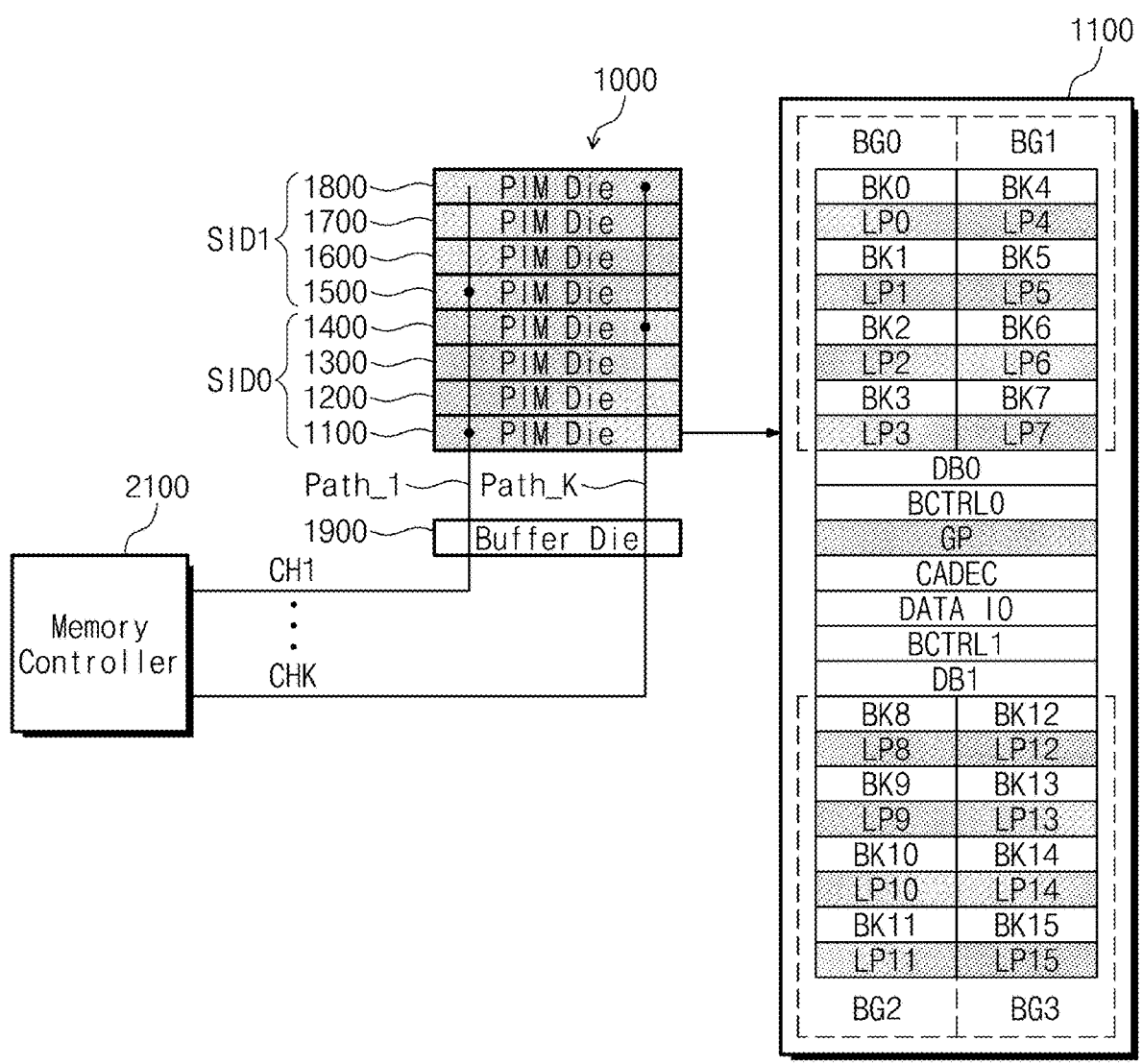
FIGS. 3 and 4 illustrate a memory device of FIGS. 1 and 2 in detail.

FIG. 3 illustrates a memory device of FIGS. 1 and 2 in detail. The memory controller 2100 may access the memory device 1000 through channels CH1 to CHk (k being a natural number of 2 or more). For example, the PIM dies 1100 and 1500 may be allocated to the channel CH1, and the PIM dies 1400 and 1800 may be allocated to the channel CHk. As in the above description, the remaining dies 1200, 1300, 1600, and 1700 may be allocated to channels. The PIM dies 1100 and 1500 allocated to the same channel CH1 may be identified by the stack identifier SID0/1. The memory device 1000 may include paths Path_1 to Path_K that respectively correspond to the channels CH1 to CHk and through which signals transmitted through the channels CH1 to CHk are transmitted. The paths Path_1 to Path_K may provide electrical connection paths between the buffer die 1900 and the PIM dies 1100 to 1800 and may include the through silicon vias TSVs and the micro bumps BPs described with reference to FIGS. 1 and 2.

The PIM die 1100 may include bank groups BG0 to BG3, data buses DB0 and DB1, bank controllers BCTRL0 and BCTRL1, a global processor GP, a command and address decoder CADEC, and a data input/output circuit DATAIO.

Only the PIM die 1100 may be in detail described and illustrated, but configurations and operations of the remaining PIM dies 1200 to 1800 may be substantially identical to those of the PIM die 1100. The bank groups may be identified by bank address bits BA2 and BA3 of a bank address BA0 to BA3 (or referred to as "bank address bits BA0 to BA3"). For example, when BA2=0 and BA3=0, the bank group BG0 may be selected. The bank group BG0 may include banks BK0 to BK3. Banks in one bank group may be identified by bank address bits BA0 and BA1 of the bank address BA0 to BA3. For example, when BA0=0, BA1=0, BA2=0, and BA3=0, the bank BK0 may be selected.

The memory cell array MCA of FIGS. 1 and 2 may be divided into banks BK0 to BK15. Each of banks BK0, BK2, BK4, BK6, BK8, BK10, BK12, and BK14 capable of being selected when the bank address bit BA0 corresponding to an LSB from among the bank address bits BA0 to BA3 is "0" may be referred to as a top (or even-numbered) bank. Each of banks BK1, BK3, BK5, BK7, BK9, BK11, BK13, and BK15 capable of being selected when the bank address bit BA0 corresponding to an LSB from among the bank address bits BA0 to BA3 is "1" may be referred to as a bottom (or odd-numbered) bank. For example, each of the banks BK0 to BK15 may include an equal number of memory cells, and each of the bank groups BG0 to BG3 may include an equal number of banks. For example, the bank groups BG0 to BG3 may be implemented to be identical, and the banks BK0 and BK15 may be implemented to be identical.

The bank group BG0 may include local processors LP0 to LP3 (LP0, LP1, LP2, LP3). For example, the local processor LP0 may perform a local calculation on data of the bank BK0 (or local bank data), the local processor LP1 may perform a local calculation on data of the bank BK1, the local processor LP2 may perform a local calculation on data of the bank BK2, and the local processor LP3 may perform a local calculation on data of the bank BK3. A local processor may be also referred to as a "local processing circuit", a "local PE", a "local PE circuit", etc.

The bank group BG1 may include local processors LP4 to LP7 (LP4, LP5, LP6, LP7) that perform local calculations on data of the banks BK4 to BK7 (BK4, BK5, BK6, BK7), respectively. As in the bank groups BG0 and BG1, the bank groups BG2 and BG3 may include local processors LP8 to LP15 (LP8, LP9, LP10, LP11, LP12, LP13, LP14, LP15) and that respectively perform local calculations on data of the banks BK8 to BK15 (BK8, BK9, BK10, BK11, BK12, BK13, BK14, BK15). For example, the local processors LP0 to LP15 may correspond to the PE of each of the PIM dies 1100 to 1800 of FIGS. 1 and 2 or may constitute the PE of each of the PIM dies 1100 to 1800 of FIGS. 1 and 2. The number of bank groups included in one PIM die 1100 and the number of banks per bank group are not limited to the example of FIG. 3. An example is illustrated as one channel CH1 is allocated to the PIM die 1100 and the bank groups BG0 to BG3 and the banks BK0 to BK15 are allocated to the channel CH1, but embodiments are not limited thereto.

A different channel(s) may be further allocated to the PIM die 1100, and the PIM die 1100 may further include bank groups and banks allocated to the different channel(s). For example, the PIM die 1100 may include the bank groups BG0 to BG15 and the banks BK0 to BK63 allocated to four channels CH1 to CH4; as in the channel CH1 exemplified in FIG. 3, bank groups and banks for each channel may be implemented in the PIM die 1100. The description is given as one bank group includes 4 local processors and one local processor is allocated to one bank; however, one bank group may include local processors, the number of which is less than the number of banks, and one local processor may be allocated to two or more banks. In any case, embodiments are not limited to the above numerical values.

The data bus DB0 may include data input/output paths associated with the bank groups BG0 and BG1. For example, data to be written in the banks BK0 to BK3 or the banks BK4 to BK7, data read from the banks BK0 to BK3 or the banks BK4 to BK7, data to be processed by the local processors LP0 to LP3 or the local processors LP4 to LP7, data processed by the local processors LP0 to LP3 or the local processors LP4 to LP7, etc. may be transmitted through the data bus DB0. The data bus DB1 may include data input/output paths associated with the bank groups BG2 and BG3. Except for allocated bank groups, the data buses DB0 and DB1 may be implemented to be identical or may be integrated.

The bank controller BCTRL0 may control the banks BK0 to BK7 of the bank groups BG0 and BG1 under control of the command and address decoder CADEC. The bank controller BCTRL1 may control the banks BK8 to BK15 of the bank groups BG2 and BG3 under control of the command and address decoder CADEC. For example, the bank controllers BCTRL0 and BCTRL1 may activate or precharge the banks BK0 to BK15. Except for allocated bank groups, the bank controllers BCTRL0 and BCTRL1 may be implemented to be identical or may be integrated.

The global processor GP may control the banks BK0 to BK15 of the bank groups BG0 to BG3 and the local processors LP0 to LP15 under control of the command and address decoder CADEC. For example, the global processor GP may select data to be processed by the local processors LP0 to LP15 or data processed by the local processors LP0 to LP15 or may control timings when the local processors LP0 to LP15 initiate or terminate the execution of local calculations. Unlike the example illustrated in FIG. 3, for example, the global processor GP may be divided into a first global processor that controls the banks BK0 to BK7 of the bank groups BG0 and BG1 and the local processors LP0 to LP7 and a second global processor that controls the banks BK8 to BK15 of the bank groups BG2 and BG3 and the local processors LP8 to LP15.

The command and address decoder CADEC may receive command and address signals CA (refer to FIG. 9) transmitted through the channel CH1 and the path Path_1, based on a clock signal CK (refer to FIG. 9) transmitted through the channel CH1 and the path Path_1. The command and address decoder CADEC may decode the command and address signals CA. The command and address decoder CADEC may control components of the PIM die 1100 based on a decoding result.

Under control of the command and address decoder CADEC, the data input/output circuit DATAIO may receive data input/output signals DQ (refer to FIG. 9) transmitted through the channel CH1 and the path Path_1 and may provide write data included in the data input/output signals DQ to the banks BK0 to BK15 of the bank groups BG0 to BG3. The data input/output circuit DATAIO may receive read data output from the banks BK0 to BK15 of the bank groups BG0 to BG3 and the local processors LP0 to LP15 and may output the data input/output signals DQ including the read data. The data input/output signals DQ including the read data may be transmitted to the memory controller 2100 through the path Path_1 and the channel CH1.

Figure 4:
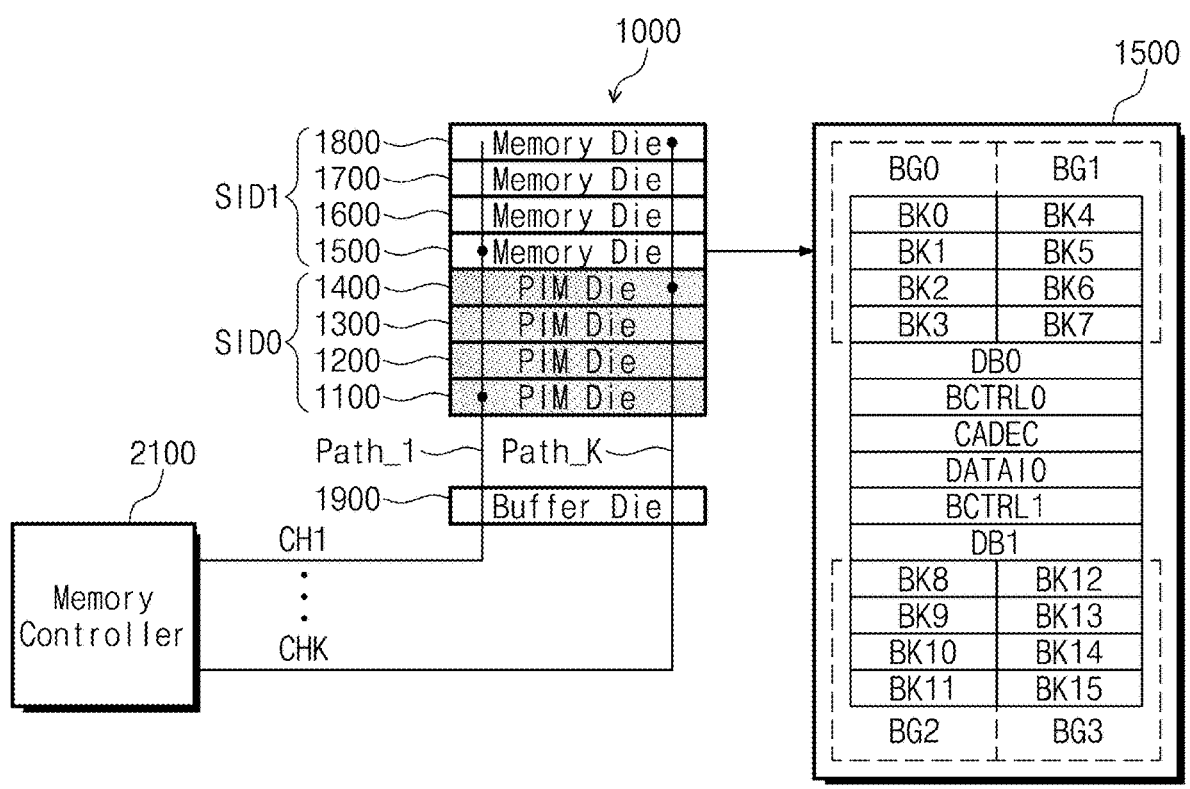

FIG. 4 illustrates a memory device of FIGS. 1 and 2 in detail. A description will be focused on a difference between the memory device 1000 of FIG. 3 and the memory device 1000 of FIG. 4. The memory device 1000 may include the PIM dies 1100 to 1400 and the memory dies 1500 to 1800. Each of the PIM dies 1100 to 1400 may be substantially identical to the PIM die 1100 of FIG. 3. Each of the memory dies 1500 to 1800 may be different from the PIM die 1100 of FIG. 3. The memory die 1500 may include the bank groups BG0 to BG3, banks BK0 to BK15, data buses DB0 and DB1, bank controllers BCTRL0 and BCTRL1, the command and address decoder CADEC, and the data input/output circuit DATAIO. The memory die 1500 may not include the local processors LP0 to LP15 and the global processor GP and may not be referred to as a "PIM die". A configurations and an operation of each of the remaining memory dies 1600 to 1800 may be substantially identical to the memory die 1500.

Figure 5:
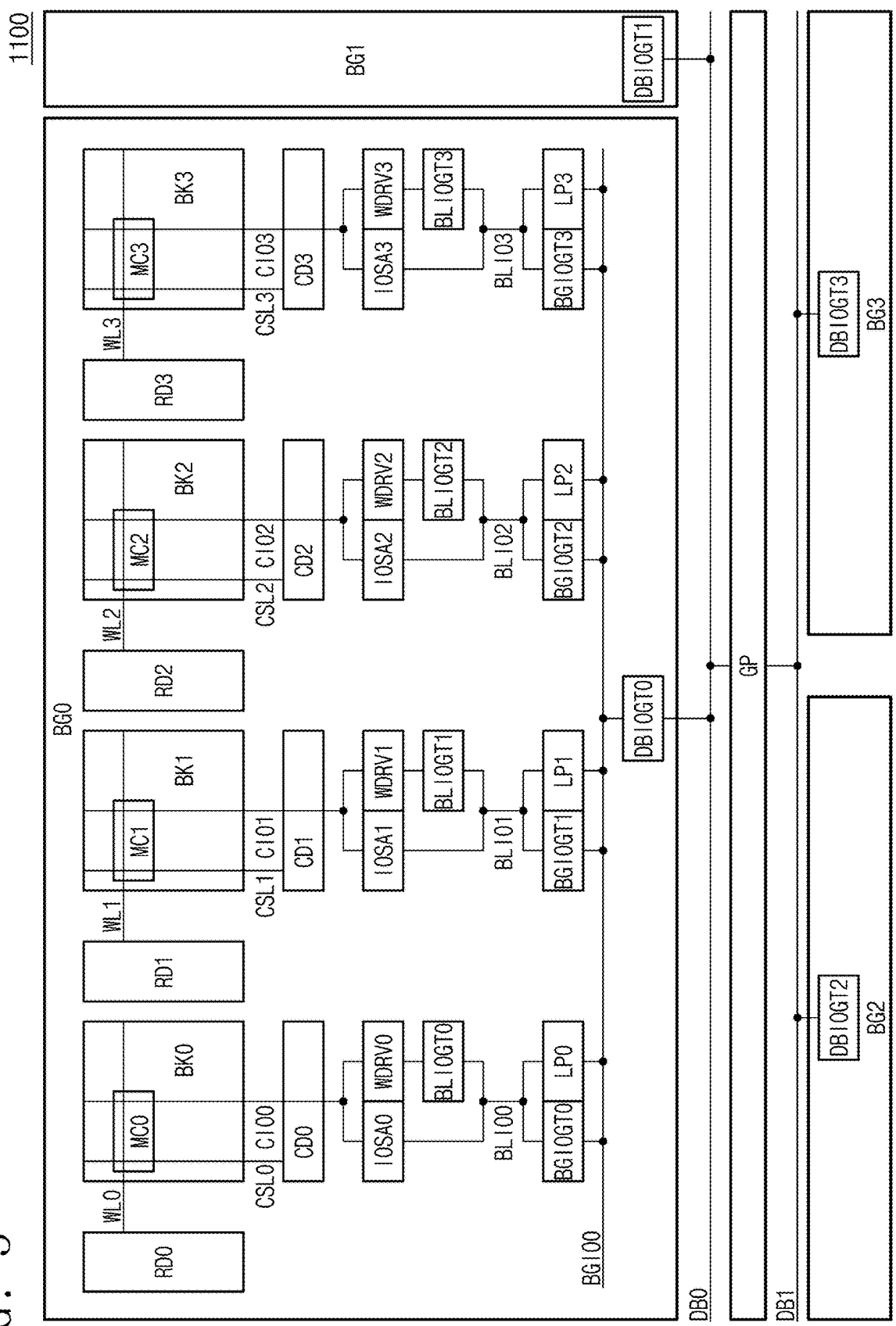
FIG. 5 illustrates a block diagram of a PIM die of FIGS. 3 and 4.

FIG. 5 illustrates a block diagram of a PIM die of FIGS. 3 and 4. Only the bank group BG0 is in detail illustrated in FIG. 5; however, as described above, the remaining bank groups BG1 to BG3 may be implemented to be identical to the bank group BG0. Components CADEC and DATAIO omitted in FIG. 5 will be described with reference to FIGS. 7 and 8. The bank group BG0 may include a row decoder RD0 and a column decoder CD0. The row decoder RD0 may decode a row address of a memory address and may select and activate a word line WL0 of the bank BK0. Here, the memory address may be output from the memory controller 2100 of FIGS. 1 and 2 and may be used to access components of the memory device 1000. For example, when the word line WL0 is activated (or inactivated), the bank BK0 may be in an active state (or a precharge state). The column decoder CD0 may decode a column address of the memory address and may select and activate a column selection line CSL0 of the bank BK0. The bank BK0 may include memory cells MC0 that are accessed through the word line WL0 and the column selection line CSL0. The bank BK0 may further include memory cells that are accessed through other word lines and other column selection lines.

The bank group BG0 may further include an input/output sense amplifier IOSA0, a write driver WDRV0, a bank local input/output gating circuit BLIOGT0, a bank global input/output gating circuit BGIOGT0, and a data bus input/output gating circuit DBIOGT0. The input/output sense amplifier IOSA0 may sense and amplify read data output from the memory cells MC0 through cell input/output lines CIO0 and may output the read data to bank local input/output lines BLIO0. The write driver WDRV0 may receive write data transmitted through the bank local input/output lines BLIO0 and may write the write data in the memory cells MC0 through the cell input/output lines CIO0.

The bank local input/output gating circuit BLIOGT0 may electrically connect the write driver WDRV0 to the bank local input/output lines BLIO0 or may electrically disconnect the write driver WDRV0 from the bank local input/output lines BLIO0. The bank local input/output gating circuit BLIOGT0 may electrically connect the input/output sense amplifier IOSA0 to the bank local input/output lines BLIO0 or may electrically disconnect the input/output sense amplifier IOSA0 from the bank local input/output lines BLIO0. The bank global input/output gating circuit BGIOGT0 may electrically connect the bank local input/output lines BLIO0 to bank global input/output lines BGIO0 or may electrically disconnect the bank local input/output lines BLIO0 from the bank global input/output lines BGIO0. The bank global input/output lines BGIO0 may be shared by the banks BK0 to BK3 in the bank group BG0. The data bus input/output gating circuit DBIOGT0 may electrically connect the bank global input/output lines BGIO0 to the data bus DB0 or may electrically disconnect the bank global input/output lines BGIO0 from the data bus DB0. The data bus DB0 may be shared by the bank groups BG0 and BG1. For example, each of the bank local input/output gating circuit BLIOGT0, the bank global input/output gating circuit BGIOGT0, and the data bus input/output gating circuit DBIOGT0 may operate as an input/output multiplexer or switch. The components RD0, CD0, IOSA0, WDRV0, BLIOGT0, and BGIOGT0 described above may be for a data input/output of the bank BK0. As in the above description, for data inputs/outputs of the banks BK1 to BK3, the bank group BG0 may further include row decoders RD1 to RD3 (RD1, RD2, RD3), column decoders CD1 to CD3 (CD1, CD2, CD3), input/output sense amplifiers IOSA1 to IOSA3 (IOSA1, IOSA2, IOSA3), write drivers WDRV1 to WDRV3 (WDRV1, WDRV2, WDRV3), bank local input/output gating circuits BLIOGT1 to BLIOGT3 (BLIOGT1, BLIOGT2, GLIOGT3), and bank global input/output gating circuits BGIOGT1 to BGIOGT3 (BGIOGT1, BGIOGT2, BGIOGT3).

The local processor LP0 may be connected to the bank local input/output lines BLIO0 and the bank global input/output lines BGIO0. The local processor LP0 may execute a local calculation on at least one of data transmitted through the bank local input/output lines BLIO0, data transmitted through the bank global input/output lines BGIO0, or internally generated data. For example, data transmitted through the bank global input/output lines BGIO0 may be substantially identical to the data transmitted through the data bus DB0.

As described above, the bank groups BG0 to BG4 may be implemented to be identical. An example is illustrated in FIG. 5 as the bank groups BG1 to BG3 include data bus input/output gating circuits DBIOGT1 to DBIOGT3, respectively, but the bank groups BG1 to BG3 may include the remaining components of the bank group BG0 described above.

The global processor GP may be connected to the data buses DB0 and DB1. The global processor GP may execute a global calculation on at least one of data transmitted through the data bus DB0, data transmitted through the data bus DB1, internally generated data, and data transmitted from the outside (e.g., the system on chip 2000) of the memory device 1000. For example, the global processor GP may execute the global calculation on at least a part or all of local calculation results of the local processors LP0 to LP15 transmitted through the bank global input/output lines BGIO0 to BGIO3, the data bus input/output gating circuits DBIOGT0 to DBIOGT3, and the data buses DB0 and DB1. For example, the global calculation may be ReLu (Rectified Linear Unit), Softmax, or calculation of the minimum value (min), the maximum value (max), or the average value (avg).

Figure 6:
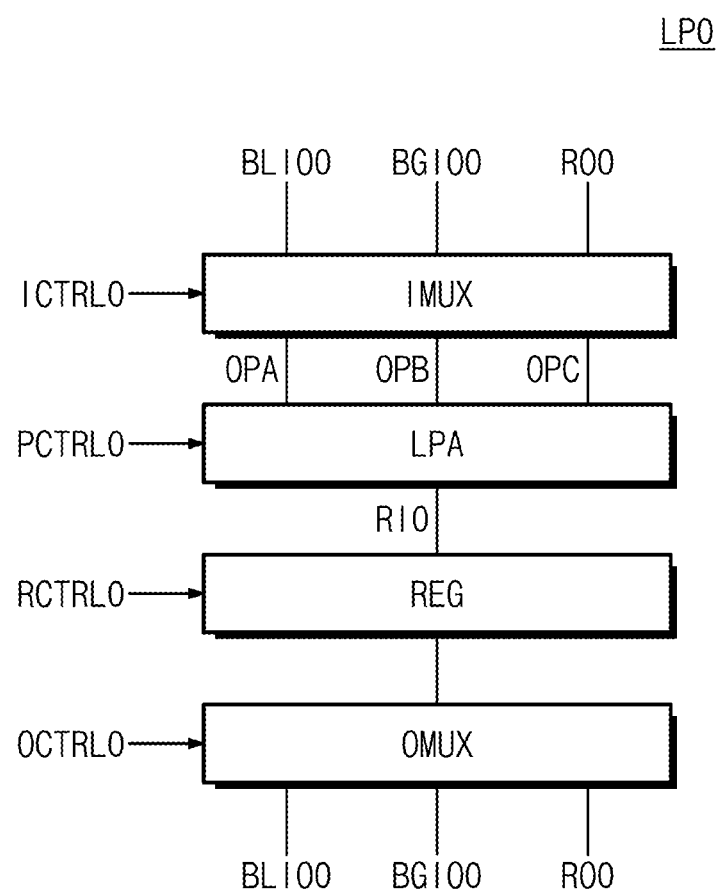
FIG. 6 illustrates a block diagram of a local processor of FIG. 5.

FIG. 6 illustrates a block diagram of a local processor of FIG. 5. The local processor LP0 may include an input multiplexer IMUX, a local processing unit (LPE) array LPA, a local register REG, and an output multiplexer OMUX. The input multiplexer IMUX may receive local bank data (or write data or read data) of the bank BK0 through the bank local input/output lines BLIO0, may receive data of the bank group BG0 through the bank global input/output lines BGIO0, and may receive local register data of register output lines RO0. Here, the data of the bank group BG0 may be one of data of other banks BK1 to BK3 in the bank group BG0, data of other banks BK4 to BK15 of other bank groups BG1 to BG3 transmitted through the data buses DB0 and DB1, broadcast data that are transmitted through the data buses DB0 and DB1 and are broadcasted by the global processor GP, and external data that are received through the data input/output circuit DATAIO and are transmitted through the data buses DB0 and DB1. The broadcast data may indicate data that the global processor GP transmits to all the local processors LP0 to LP15 or all the banks BK0 to BK15. The input multiplexer IMUX may provide at least one of the above-described data to the LPE array LPA based on an input control signal ICTRL0, and the above-described data may be provided to the LPE array LPA as operands OPA to OPC.

The LPE array LPA may execute a local calculation on at least one of the above-described data based on a processing control signal PCTRL0. For example, the local calculation executable by the LPE array LPA may be various arithmetic or logic operations such as addition, subtraction, multiplication, division, shift, AND, NAND, OR, NOR, XNOR, and XOR. The local register REG may receive and store a local calculation result of the local calculation of the LPE array LPA through register input lines RI0 based on a register control signal RCTRL0. The local register REG may output the stored local calculation result as local register data to the register output lines RO0 based on the register control signal RCTRL0. The output multiplexer OMUX may output the local register data of the local register REG to at least one of the bank local input/output lines BLIO0, register output lines RO0, and the bank global input/output lines BGIO0, based on an output control signal OCTRL0.

Figure 7:
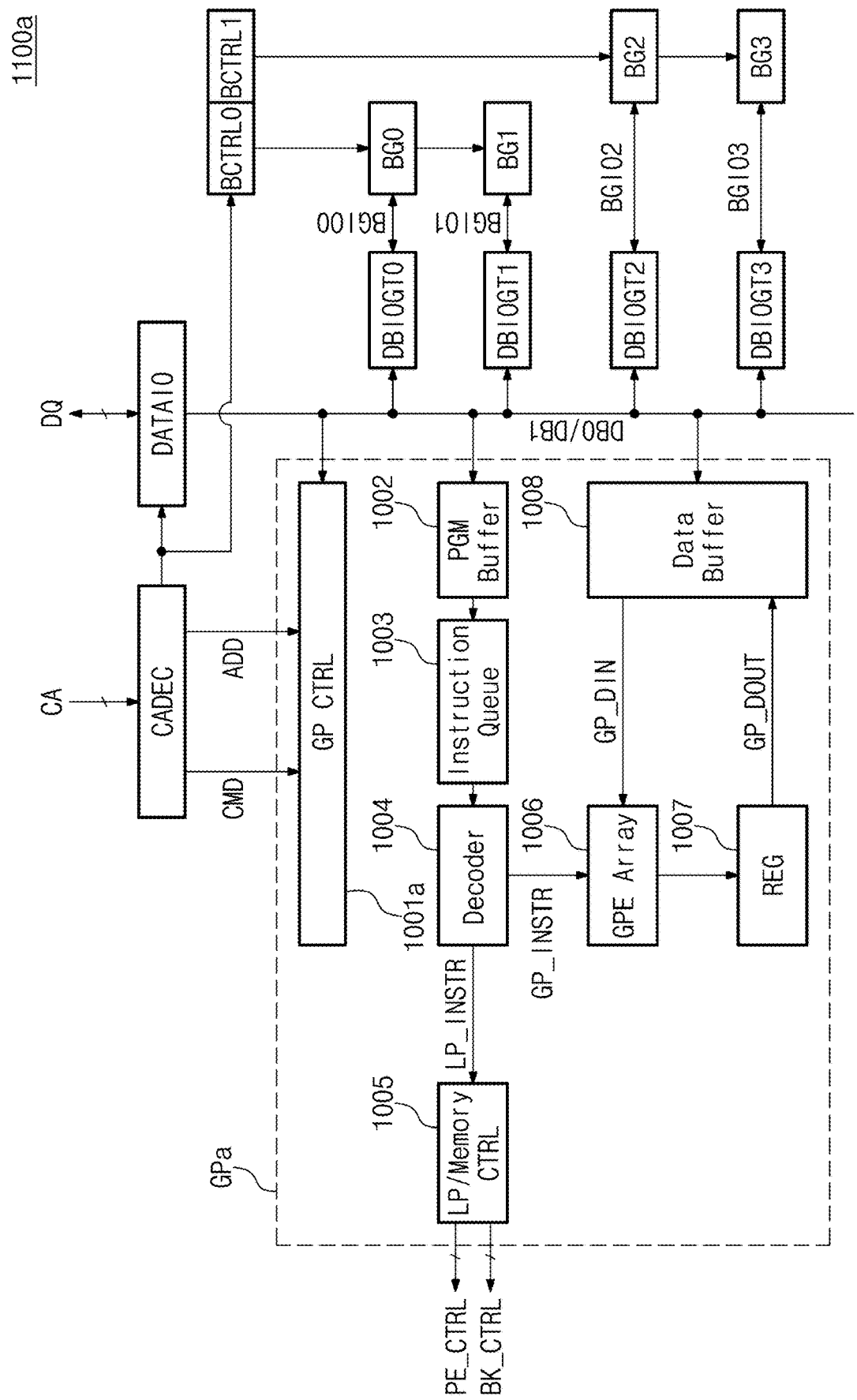
FIGS. 7 and 8 illustrate a block diagram of a PIM die of FIGS. 3 and 4.

FIG. 7 illustrates a block diagram of a PIM die of FIGS. 3 and 4. A PIM die 1100a may be an example of the PIM die 1100 of FIGS. 3 and 4. The command and address decoder CADEC may decode the command and address signals CA and may control the bank controllers BCTRL0 and BCTRL1, and the data input/output circuit DATAIO, and a global processor GPa. The bank controller BCTRL0 may control read and write operations of memory cells of the bank groups BG0 and BG1. The bank controller BCTRL1 may control read and write operations of memory cells of the bank groups BG2 and BG3. The data input/output circuit DATAIO may output data of the data input/output signals DQ to the data buses DB0 and DB1 or may output the data input/output signals DQ including data of the data buses DB0 and DB1. The data buses DB0 and DB1 may be separated from each other like the examples of FIGS. 3 to 5 or may be integrated as one bus like the example of FIG. 7.

The global processor GPa may be an example of the global processor GP of FIG. 5. The global processor GPa may include a processor controller 1001a, a program buffer 1002, an instruction queue 1003, an instruction decoder 1004, a local processor and memory controller 1005, a global processing element (GPE) array 1006, a global register 1007, and a data buffer 1008. The processor controller 1001a may receive a command CMD and a memory address ADD from the command and address decoder CADEC. The processor controller 1001a may control the remaining components 1002 to 1008 of the global processor GPa based on the command CMD and the memory address ADD. For example, the processor controller 1001a may include a control register that stores control information. The control information stored in the control register may be changed by the command CMD and the memory address ADD. The processor controller 1001a may control the remaining components 1002 to 1008 of the global processor GPa based on the control information.

The program buffer 1002 may store a program of a host. The host may be the system on chip 2000 or a device outside the memory device 1000. In an embodiment, as illustrated in FIG. 7, the data input/output circuit DATAIO may receive the data input/output signals DQ including the program of the host and may output the program of the host to the data buses DB0 and DB1. The program buffer 1002 may receive and store the program of the host through the data buses DB0 and DB1. In another embodiment, unlike the example illustrated in FIG. 7, the command and address decoder CADEC may receive the command and address signals CA including the program of the host and may output the program of the host to the program buffer 1002. In any case, the program of the host stored in the program buffer 1002 may be updated. The program buffer 1002 may write or provide instructions of the program to the instruction queue 1003. The instruction queue 1003 may store the instructions of the program in the program buffer 1002. The instruction decoder 1004 may fetch the instructions stored in the instruction queue 1003 and may decode the instructions. The instruction decoder 1004 may determine whether a decoded instruction is associated with a local calculation (or processing) or a global calculation. For example, the local calculation may indicate calculations executable by the local processors described with reference to FIGS. 3 to 6, and the global calculation may indicate a calculation executable by the global processor GP.

When the decoded instruction is associated with the local calculation, the instruction decoder 1004 may provide local calculation instruction information LP_INSTR to the local processor and memory controller 1005. The local processor and memory controller 1005 may control the local processors LP0 to LP15 and the banks BK0 to BK15 based on the local calculation instruction information LP_INSTR. For example, the local processor and memory controller 1005 may generate PE control signals PE_CTRL based on the local calculation instruction information LP_INSTR. The PE control signals PE_CTRL may include the control signals ICTRL0, PCTRL0, RCTRL0, and OCTRL0 (refer to FIG. 6) to be provided to the local processor LP0 and remaining control signals to be provided to the remaining local processors LP1 to LP15. Also, the local processor and memory controller 1005 may generate bank control signals BK_CTRL based on the local calculation instruction information LP_INSTR. The local processor and memory controller 1005 may provide or transmit the bank control signals BK_CTRL as the bank controller BCTRL0 and BCTRL1. The bank controllers BCTRL0 and BCTRL1 may control read and write operations of memory cells of the bank groups BG0 to BG3 in response to the bank control signals BK_CTRL. The global processor GPa may execute the program of the host; as the program is executed, the global processor GPa may control the local processors LP0 to LP15 or may control the banks BK0 to BK15. Under control of the global processor GPa, the local processors LP0 to LP15 may execute calculations, and data inputs/outputs of the banks BK0 to BK15 may be performed. The global processor GPa may execute the program of the host by requesting calculations executable by the local processors LP0 to LP15 or data inputs/outputs of the banks BK0 to BK15. In an embodiment, based on the local calculation instruction information LP_INSTR, the local processor and memory controller 1005 may control one of the local processors LP0 to LP15 or may simultaneously control two or more of the local processors LP0 to LP15. Also, based on the local calculation instruction information LP_INSTR, the local processor and memory controller 1005 may control one of the banks BK0 to BK15 or may simultaneously control two or more of the banks BK0 to BK15. For example, the local processor and memory controller 1005 may process at least one of bits of a bank address for identifying the banks BK0 to BK15 as a Don't Care bit.

When the decoded instruction is associated with the global calculation, the instruction decoder 1004 may provide global calculation instruction information GP_INSTR to the GPE array 1006. The GPE array 1006 may execute a global calculation based on the global calculation instruction information GP_INSTR. For example, the calculation executable by the GPE array 1006 may be various arithmetic or logic operations such as addition, subtraction, multiplication, division, shift, AND, NAND, OR, NOR, XNOR, and XOR. The global register 1007 may store a global calculation result of the global calculation executed by the GPE array 1006. The global register 1007 may provide the global calculation result as global calculation output data GP_DOUT to the data buffer 1008. The data buffer 1008 may receive local calculation results of local calculations executed by the local processors LP0 to LP15 through the data buses DB0 and DB1, may receive external data included in the data input/output signals DQ transmitted from the data input/output circuit DATAIO through the data buses DB0 and DB1, and may receive the global calculation output data GP_DOUT. The data buffer 1008 may provide the GPE array 1006 with at least one of the local calculation results, the external data, and the global calculation output data GP_DOUT as global calculation input data GP_DIN. The data buffer 1008 may output the global calculation output data GP_DOUT to the data buses DB0 and DB1. The data input/output circuit DATAIO may output the data input/output signals DQ including the global calculation output data GP_DOUT.

The memory controller 2100 of the system on chip 2000 may request calculations executable by the local processors LP0 to LP15 or data inputs/outputs of the banks BK0 to BK15 by transmitting the command and address signals CA to the memory device 1000. As described above, the global processor GPa may execute the program of the host. As in the memory controller 2100 as an embedded memory controller, the global processor GPa may request calculations executable by the local processors LP0 to LP15 or data inputs/outputs of the banks BK0 to BK15. For example, as the global processor GPa executes the program of the host, the global processor GPa may execute on-die processing by requesting data inputs/outputs (e.g., read and write operations) of the banks BK0 to BK15 or calculations executable by the local processors LP0 to LP15 or executing a global calculation. In other words, the term 'On-Die Processing' may mean, on a single die (for example, 1100a), the performing, by a global processor (for example, GPa) which belongs to the single die, a calculation (or processing) of data stored in the banks (for example, BK0 to BK15) which belong to the single die, or of results of the calculations executable by the local processors (for example, LP0 to LP15) belonging to the single die. Accordingly, the calculated (or processed) data may be output as a result of the on-die processing from the single die to the external device (for example, a host).

Figure 8:
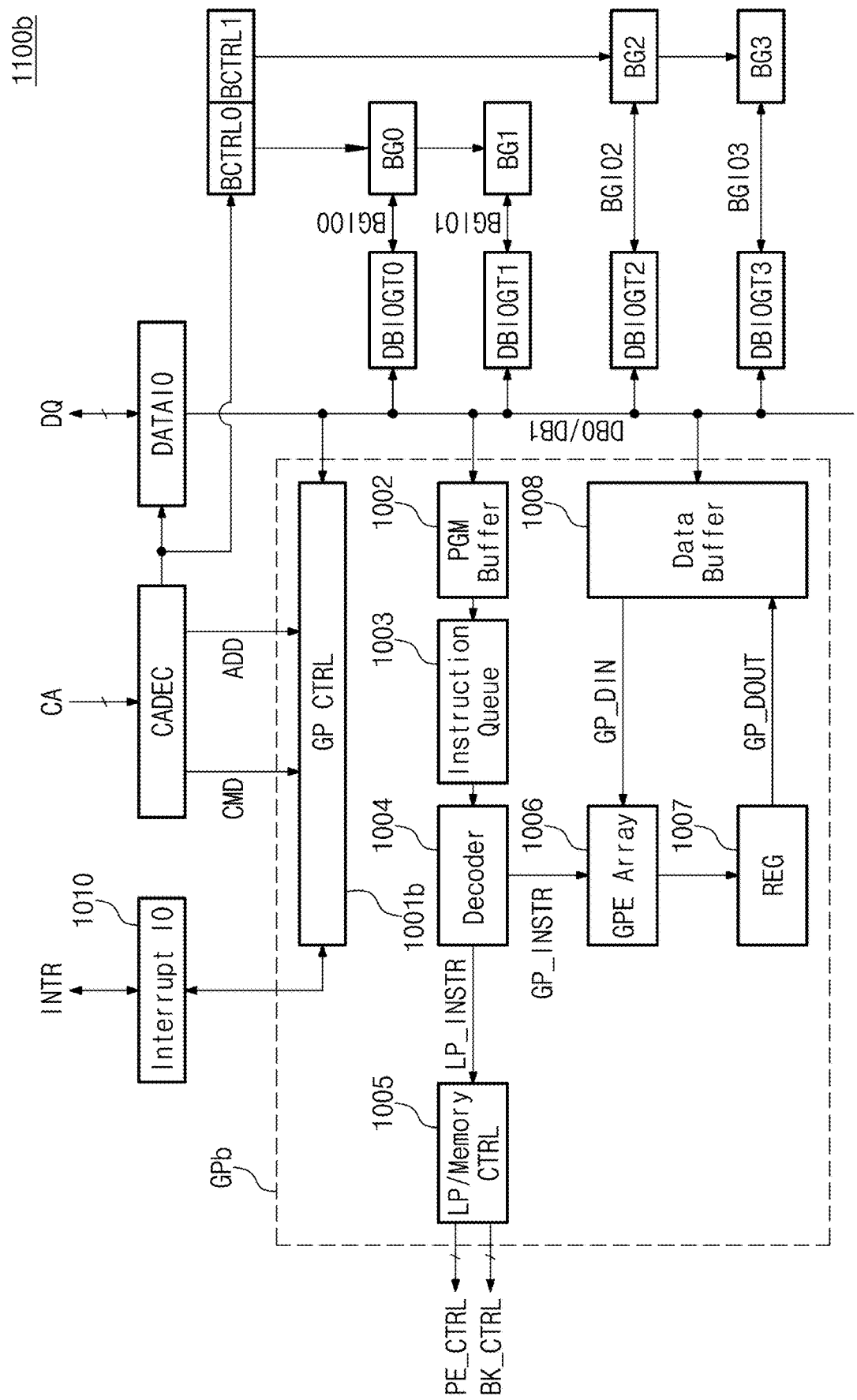

FIG. 8 illustrates a block diagram of a PIM die of FIGS. 3 and 4. A PIM die 1100b may be another example of the PIM die 1100 of FIGS. 3 and 4. A description will be focused on a difference between the PIM die 1100b and the PIM die 1100a. The PIM die 1100b may further include an interrupt input/output circuit 1010. The interrupt input/output circuit 1010 may receive an interrupt signal INTR (or a start interrupt signal) transmitted from the memory controller 2100 of the system on chip 2000 and may provide the interrupt signal INTR to a processor controller 1001b of a global processor GPb. The interrupt input/output circuit 1010 may receive the interrupt signal INTR (or an end interrupt signal) transmitted from the processor controller 1001b of the global processor GPb and may provide the interrupt signal INTR to the memory controller 2100 of the system on chip 2000. For example, the interrupt signal INTR may be a bidirectional signal that is similar to the data input/output signals DQ. For another example, the interrupt signal INTR may be a unidirectional signal, and the start interrupt signal INTR transmitted from the memory controller 2100 of the system on chip 2000 and the end interrupt signal INTR provided from the processor controller 1001b of the global processor GPb may be different.

The processor controller 1001b may control the remaining components 1002 to 1008 of the global processor GPb based on the interrupt signal INTR in addition to the command CMD and the address ADD. For example, the processor controller 1001b may control the remaining components 1002 to 1008 of the global processor GPb in response to the interrupt signal INTR such that the execution of on-die processing initiates. When a global calculation is completed, the processor controller 1001b may generate the interrupt signal INTR indicating that the global calculation is completed and may provide the interrupt signal INTR to the interrupt input/output circuit 1010.

Figure 9:
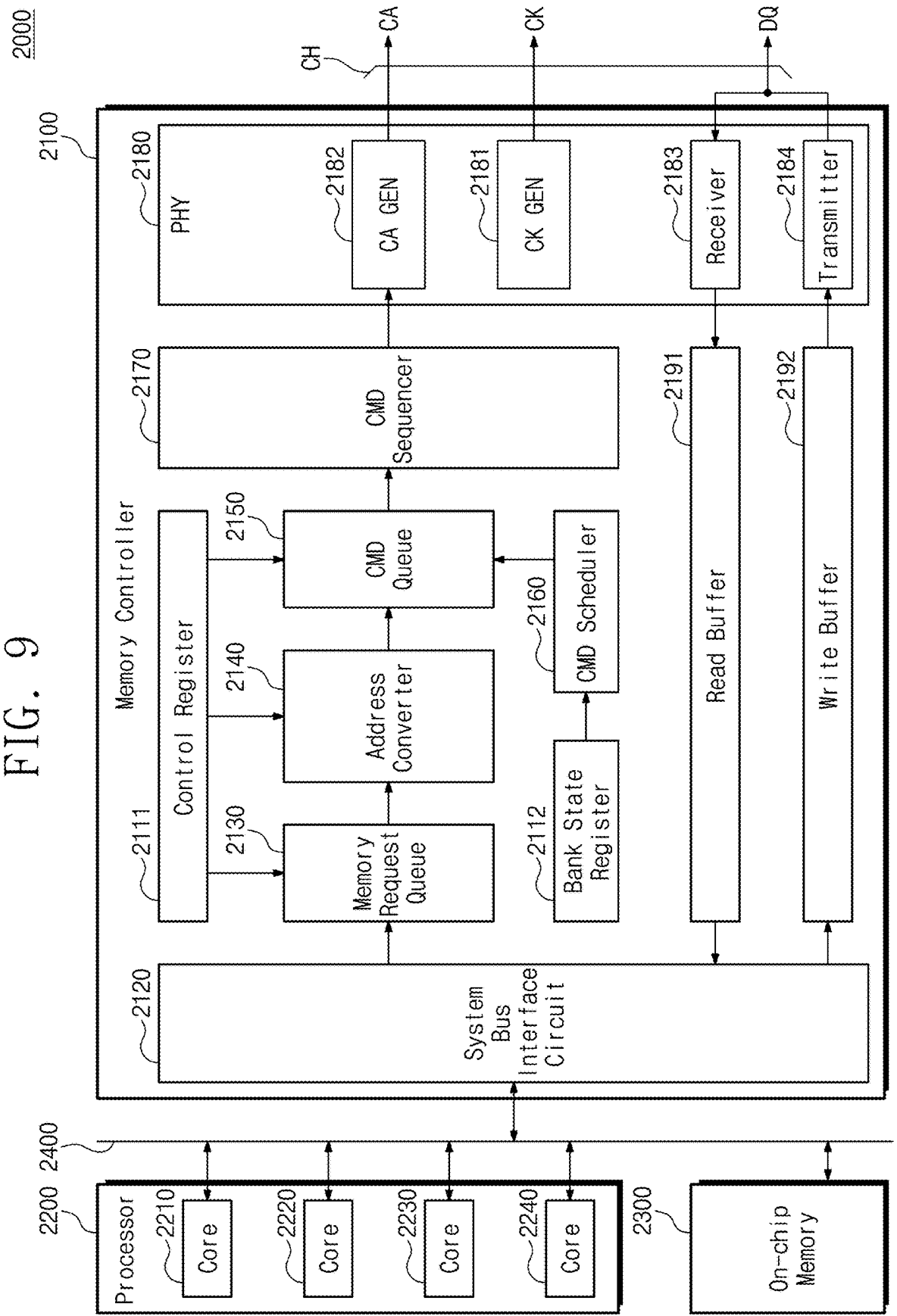
FIG. 9 illustrates a block diagram of a system on chip of FIGS. 1 and 2.

FIG. 9 illustrates a block diagram of a system on chip of FIGS. 1 and 2. The system on chip 2000 may include the memory controller 2100, a processor 2200, an on-chip memory 2300, and a system bus 2400.

The memory controller 2100 may include a control register 2111, a bank state register 2112, a system bus interface circuit 2120, a memory request queue 2130, an address converter 2140, a memory command queue 2150, a command scheduler 2160, a command sequencer 2170, the PHY 2180, a read buffer 2191, and a write buffer 2192.

The control register 2111 may store and provide pieces of control information of the components 2120, 2130, 2140, 2150, 2160, 2170, 2180, 2191, and 2192 in the memory controller 2100. The control information stored in the control register 2111 may be changed by the processor 2200 or by a request of a user. The components 2120, 2130, 2140, 2150, 2160, 2170, 2180, 2191, and 2192 may operate based on the pieces of control information stored in the control register 2111, respectively.

The bank state register 2112 may store state information of a plurality of banks (refer to FIGS. 3 and 4) in the memory device 1000. For example, the state information may indicate whether a bank is activated or whether a bank is precharged.

The system bus interface circuit 2120 may receive memory requests transmitted from a plurality of cores 2210 to 2240 in the processor 2200 through the system bus 2400 based on a communication protocol of the system bus 2400. The system bus interface circuit 2120 may provide, transmit, or write the received memory request to the memory request queue 2130.

The memory request queue 2130 may receive and store a memory request that is generated in the system on chip 2000 and is provided from the system bus interface circuit 2120. A memory request associated with the memory device 1000 may request an operation (e.g., a read operation, a write operation, a refresh operation, or processing) of the memory device 1000 and may include a physical address of the memory device 1000. The physical address may be used to access the memory device 1000 and may be limited according to a capacity of the memory device 1000 unlike a virtual address. A speed at which a memory request is generated at the system on chip 2000 may be higher than a speed at which a memory request is processed by the memory device 1000. The memory request queue 2130 may store a plurality of memory requests.

The address converter 2140 may convert a physical address of a memory request stored in the memory request queue 2130 into a memory address. For example, the address converter 2140 may map some bits of the physical address onto the memory address. Some bits of the physical address may correspond to the memory address. The memory address may include a stack identifier SID, a bank address, a row address, and a column address. The stack identifier SID may be used to identify the PIM dies 1100 to 1800 described with reference to FIGS. 1 to 2. The bank address may be used to identify the banks BK0 to BK15 constituting the memory cell array MCA of each of the PIM dies 1100 to 1800. The row address and the column address may be used to identify memory cells (e.g., MC0) in a bank.

The memory command queue 2150 may store memory commands for memory requests stored in the memory command queue 2150 and memory addresses converted by the address converter 2140. The command scheduler 2160 may adjust the order of processing memory commands and memory addresses stored in the memory command queue 2150 based on state information of banks stored in the bank state register 2112. The command scheduler 2160 may perform scheduling on memory commands and memory addresses stored in the memory command queue 2150. The command sequencer 2170 may output or provide memory commands and memory addresses stored in the memory command queue 2150 to the PHY 2180 based on the order scheduled by the command scheduler 2160.

The PHY 2180 may access the memory device 1000 based on a memory command and a memory address provided from the command sequencer 2170. The PHY 2180 may be also referred to as a "memory interface circuit". For example, the PHY 2180 may generate and output the command and address signals CA based on a memory request of the memory request queue 2130 and a memory address of the address converter 2140. The PHY 2180 may transmit a memory command and a memory address, which are based on a memory request, to the memory device 1000. The PHY 2180 may include a clock generator 2181, a command and address generator 2182, a receiver 2183, and a transmitter 2184. The clock generator 2181 may generate a clock signal CK that is output to the memory device 1000. For example, the memory device 1000 may be a synchronous memory device that operates based on the clock signal CK. The command and address generator 2182 may receive a memory command and a memory address from the command sequencer 2170 and may transmit the command and address signals CA including the memory command and the memory address to the memory device 1000. The command and address generator 2182 may variously change logical values of the command and address signals CA depending on a memory request of the memory request queue 2130 and a memory address of the address converter 2140. The receiver 2183 may receive the data input/output signals DQ including read data transmitted from the memory device 1000. The receiver 2183 may provide the received read data to the read buffer 2191. The transmitter 2184 may receive write data from the write buffer 2192. The transmitter 2184 may transmit the data input/output signals DQ including the write data to the memory device 1000.

A channel CH of FIG. 9 may correspond to one of the channels CH1 to CHK of FIGS. 3 and 4. The command and address signals CA and the data input/output signals DQ may be provided with respect to the channel CH. The PHY 2180 may generate and output the clock signal CK and the command and address signals CA of each of the channels CH1 to CHK and may exchange the data input/output signals DQ of each of the channels CH1 to CHK with the memory device 1000. It is assumed that the number of channels CH1 to CHK of FIGS. 3 and 4 is "4" (i.e., K=4). However, embodiments are not limited to the numerical values described above. For example, the memory controller 2100 may access the PIM dies 1100 and 1500 through the channel CH1, may access the PIM dies 1200 and 1600 through the channel CH2, may access the PIM dies 1300 and 1700 through the channel CH3, and may access the PIM dies 1400 and 1800 through the channel CH4. The PIM dies 1100 and 1500 may share the channel CH1, the PIM dies 1200 and 1600 may share the channel CH2, the PIM dies 1300 and 1700 may share the channel CH3, and the PIM dies 1400 and 1800 may share the channel CH4.

The memory controller 2100 may select one of a plurality of PIM dies allocated to one channel, by using the stack identifier SID of a memory address. The memory controller 2100 may access one of a plurality of PIM dies allocated to one channel, by using a memory address. For example, when the stack identifier SID has a first logical value (i.e., SID0), the command and address signals CA and the data input/output signals DQ transmitted through the channels CH1 to CH4 may be associated with the PIM dies 1100 to 1400. For example, when the stack identifier SID has a second logical value (i.e., SID1), the command and address signals CA and the data input/output signals DQ transmitted through the channels CH1 to CH4 may be associated with the PIM dies 1500 to 1800. For example, the number of PIM dies allocated per channel, the number of channels, the number of channels allocated to one PIM die, etc. are not limited to the examples described above. For example, a part of bits of a physical address may indicate whether a memory address is associated with any channel of the channels CH1 to CH4 and may be used to distinguish the channels CH1 to CH4.

The read buffer 2191 may store read data provided from the receiver 2183. For example, the read buffer 2191 may provide the system bus interface circuit 2120 with read data as much as a cache line CL, and the system bus interface circuit 2120 may transmit the read data to the processor 2200 or the on-chip memory 2300 through the system bus 2400. The write buffer 2192 may receive and store write data that are provided from the system bus interface circuit 2120 so as to be transmitted to the memory device 1000. The write buffer 2192 may provide the transmitter 2184 with write data as much as a data input/output unit of the memory device 1000.

The processor 2200 may execute various software (e.g., an application program, an operating system, a file system, and a device driver) loaded onto the on-chip memory 2300. The processor 2200 may include a plurality of homogeneous cores or a plurality of heterogeneous cores and may include a plurality of cores 2210 to 2240. For example, each of the cores 2210 to 2240 may include at least one of a central processing unit (CPU), an image signal processing unit (ISP), a digital signal processing unit (DSP), a graphics processing unit (GPU), a vision processing unit (VPU), a tensor processing unit (TPU), and a neural processing unit (NPU). Each of the cores 2210 to 2240 may generate a memory request associated with the memory device 1000. The memory request generated by each of the cores 2210 to 2240 may include the physical address described above. For example, the processor 2200 may execute system processing by using the memory controller 2100 that accesses, through the channel CH, the PIM/memory die 1500 among the PIM dies 1100 and 1500 of the memory device 1000, which share the channel CH. The on-die processing executable by the global processor GPa/GPb of FIGS. 7 and 8 and the system processing may be executed independently (or separately).

An application program, an operating system, a file system, a device driver, etc. for driving the electronic device 100a/100b may be loaded onto the on-chip memory 2300. For example, the on-chip memory 2300 may be a static RAM (SRAM) having a data input/output speed higher than the memory device 1000 or may be a cache memory shared by the cores 2210 to 2240, but embodiments are not limited thereto. The system bus 2400 may provide a communication path between the memory controller 2100, the processor 2200, and the on-chip memory 2300. For example, the system bus 2400 may be AHB (Advanced High-performance Bus), ASB (Advanced System Bus), APB (Advanced Peripheral Bus), or AXI (Advanced eXtensible Interface) that is based on the AMBA (Advanced Microcontroller Bus Architecture).

Figure 10:
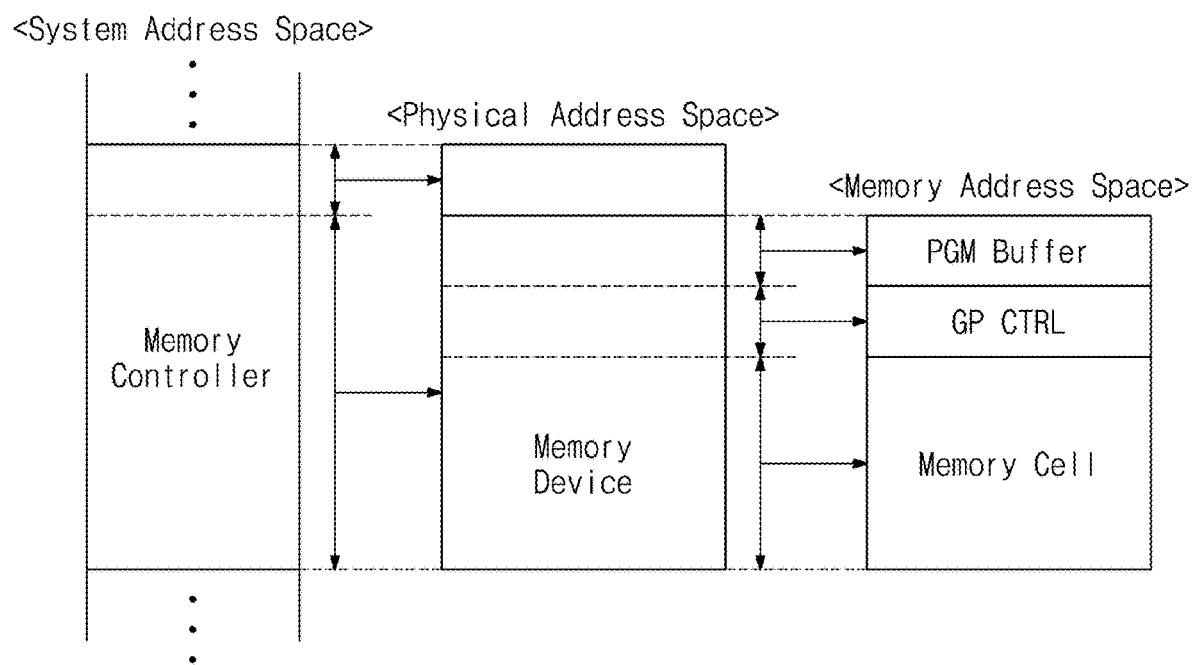
FIG. 10 illustrates an example in which a processor of FIG. 9 accesses a memory controller and a memory controller accesses a memory device.

FIG. 10 illustrates an example in which a processor of FIG. 9 accesses a memory controller and a memory controller accesses a memory device. For example, the processor 2200 may access the memory controller 2100 in a memory mapped I/O (MMIO) manner. A system address space (or area) may include a space allocated to the memory controller 2100. Although not illustrated in drawing, the system address space may further include spaces respectively allocated to any other components (e.g., the on-chip memory 2300, intellectual property (IP) blocks, and controllers) in the system on chip 2000. The processor 2200 may access and control the memory controller 2100 and any other components in the system on chip 2000 by using the same system address space. The processor 2200 may access a space allocated to the memory controller 2100 from among the system address space and may write a value in the space allocated to the memory controller 2100 by using a write instruction. The memory controller 2100 may respond to the value and, for example, may receive a memory request of the processor 2200. The memory controller 2100 may ignore a value written in the remaining space other than the space allocated to the memory controller 2100 from among the system address space.

The space allocated to the memory controller 2100 from among the system address space may be a physical address space, may correspond to the physical address space, or may be mapped onto the physical address space. The physical address space may correspond to a range of physical addresses associated with a memory request. The physical address space may include a space allocated to the control register 2111 and a space allocated to the memory device 1000. The space allocated to the memory controller 2100 from among the system address space may include a space corresponding to the space allocated to the control register 2111 from among the physical address space, and the processor 2200 may change a value (or information) of the control register 2111 by accessing the space corresponding to the space allocated to the control register 2111. As in the above description, the space allocated to the memory controller 2100 from among the system address space may include a space corresponding to the space allocated to the memory device 1000 from among the physical address space, and the processor 2200 may access the memory device 1000 by accessing the space corresponding to the space allocated to the memory device 1000.

The memory controller 2100 may also access the memory device 1000 in the MMIO manner. The physical address space may include the space allocated to the memory device 1000. The memory controller 2100 may access the space allocated to the memory device 1000 from among the physical address space and may convert a physical address of the space allocated to the memory device 1000 from among the physical address space into a memory address.

The space allocated to the memory device 1000 from among the physical address space may be a memory address space, may correspond to the memory address space, or may be mapped onto the memory address space. The memory address space may correspond to a range of memory addresses. The memory address space may include a space allocated to the program buffer 1002 of the global processor GP, a space allocated to control registers of the processor controller 1001a/1001b of the global processor GP, and a space allocated to memory cells. The space allocated to the memory device 1000 from among the physical address space may include a space corresponding to the space allocated to the program buffer 1002 of the global processor GP from among the memory address space, and the memory controller 2100 may change a value (or information) of the program buffer 1002 of the global processor GP by accessing the space corresponding to the space allocated to the program buffer 1002. The space allocated to the memory device 1000 from among the physical address space may include a space corresponding to the space allocated to the control registers of the processor controller 1001a/1001b of the global processor GP from among the memory address space, and the memory controller 2100 may change a value (or information) of the control registers of the processor controller 1001a/1001b of the global processor GP by accessing the space corresponding to the space allocated to the control registers of the processor controller 1001a/1001b. The space allocated to the memory device 1000 from among the physical address space may include a space corresponding to the space allocated to the memory cells from among the physical address space, and the memory controller 2100 may access the memory cells by accessing the space corresponding to the space allocated to the memory cells.

Memory cells of each of the banks BK0 to BK15 of each of the PIM dies 1100 to 1800 of the memory device 1000, the program buffer 1002 of the global processor GPa/GPb of each of the PIM dies 1100 to 1800 of the memory device 1000, and a control register of the processor controller 1001a/1001b all may be mapped on a memory address associated with each of the PIM dies 1100 to 1800 of the memory device 1000. For example, the memory controller 2100 may access the memory cells, the program buffer 1002, and the control register of the processor controller 1001a/1001b by generating or issuing various commands for the memory device 1000 defined in the JEDEC (Joint Electron Device Engineering Council) standard. For example, the commands for the memory device 1000 may include an activation command, a precharge command, a read command, a write command, etc. associated with memory cells. Because the memory cells, the program buffer 1002, and the control register of the processor controller 1001a/1001b all are mapped onto the memory address, the memory controller 2100 may access the control register of the processor controller 1001a/1001b and the program buffer 1002 of the global processor GPa/GPb by using the above commands associated with the memory cells. For another example, various commands for the memory device 1000 may further include a dedicated command(s) for accessing the control register of the processor controller 1001a/1001b and the program buffer 1002 of the global processor GPa/GPb, as well as the above commands associated with the memory cells.

Figure 11:
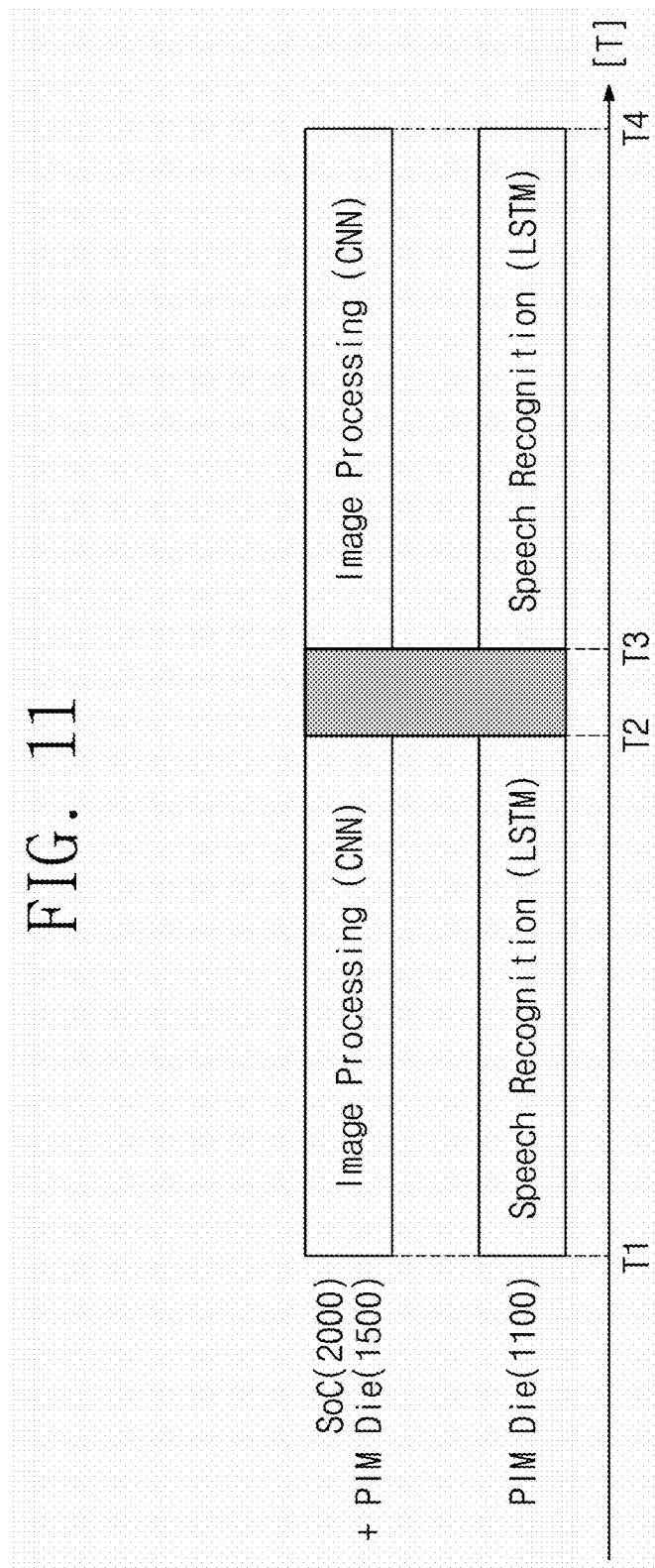
FIG. 11 illustrates an example in which an electronic device of FIGS. 1 and 2 simultaneously performs a plurality of processing.

FIG. 11 illustrates an example in which an electronic device of FIGS. 1 and 2 simultaneously performs a plurality of processing. The system on chip 2000 may access the PIM dies 1100 and 1500 of the memory device 1000 through the channel CH1 (refer to FIGS. 3 and 4).

For example, the processor 2200 (hereinafter referred to as a "system processor") of the system on chip 2000 may execute system processing by using the memory controller 2100 that accesses the banks BK0 to BK15 of the PIM die (refer to FIG. 3) through the channel CH1. For another example, the system processor 2200 may execute system processing by using the memory controller 2100 that accesses the banks BK0 to BK15 of the memory die (refer to FIG. 4) not including the global processor GP through the channel CH1.

For example, the system processing may be image processing based on a neural network (e.g., a convolution neural network (CNN)), but may be, but is not limited to, a deep neural network (DNN), a recurrent neural network (RNN), a spiking neural network (SNN), etc. Under control of the memory controller 2100, the PIM/memory die 1500 may write data transmitted from the memory controller 2100 in the banks BK0 to BK15 or may transmit data of the banks BK0 to BK15 to the memory controller 2100. The PIM/memory die 1500 may perform a data input/output with the memory controller 2100. The memory controller 2100 may access the banks BK0 to BK15 of the PIM/memory die 1500, the local processors LP0 to LP15, or the global processor GP in response to a memory request of the system processor 2200. The global processor GP of the PIM die 1500 may execute a global calculation based on a request of the memory controller 2100. However, because the memory controller 2100 is capable of accessing the banks BK0 to BK15 or the local processors LP0 to LP15, the global processor GP of the PIM die 1500 may control the banks BK0 to BK15 or the local processors LP0 to LP15 in response to only a request of the memory controller 2100 and may not automatically control the banks BK0 to BK15 or the local processors LP0 to LP15.

The system processor 2200 may simultaneously perform a plurality of processing by using the plurality of PIM dies 1100 and 1500 of the memory device 1000, which share one channel CH1. One of the plurality of processing may be the system processing described above. The memory controller 2100 may transmit a program for one of the plurality of processing to the program buffer 1002 of the global processor GP in the PIM die 1100, based on a memory request of the system processor 2200. The memory controller 2100 may transmit the data input/output signals DQ including the program to the PIM die 1100 through the channel CH1, and the data input/output circuit DATAIO of the PIM die 1100 may transmit the program to the program buffer 1002 through the data buses DB0 and DB1. The global processor GP of the PIM die 1100 may decode an instruction of the program and may control the banks BK0 to BK15 and the local processors LP0 to LP15 based on a decoding result. The global processor GP may execute on-die processing by requesting data inputs/outputs of the banks BK0 to BK15 or local calculations of the local processors LP0 to LP15 or executing a global calculation. That is, the system processor 2200 may execute system processing by using the memory controller 2100 that performs the data inputs/outputs with the PIM/memory die 1500 and may request the execution of on-die processing from the global processor GP of the PIM die 1100 by using the memory controller 2100. Depending on a memory request of the system processor 2200, the memory controller 2100 may control the PIM die 1100 such that the PIM die 1100 among the PIM dies 1100 and 1500 sharing the channel CH1 executes on-die processing and may control the PIM die 1500 such that the remaining PIM die 1500 among the PIM dies 1100 and 1500 sharing the channel CH1 is used for system processing executable by the system processor 2200. For example, the on-die processing may be, but is not limited to, speech recognition processing based on a neural network (e.g., an LSTM (Long Short Term Memory) network).

Referring to FIG. 11, during an interval from T1 to T2 and an interval from T3 to T4, the system processor 2200 may execute system processing by using the memory controller 2100 that accesses the PIM/memory die 1500 through the channel CH1. Also, the system processor 2200 may request on-die processing of the PIM die 1100 by using the memory controller 2100, and the global processor GP of the PIM die 1100 may execute the on-die processing. During an interval from T2 to T3, the system processor 2200 may receive an on-die processing result of the on-die processing of the PIM die 1100 by using the memory controller 2100. The system processor 2200 may execute on a calculation on a system processing result and the on-die processing result to generate new data. Alternatively, the system processor 2200 may receive data from the PIM/memory die 1500 and the PIM die 1100 and may generate new data by executing a calculation on the received data. The system processor 2200 may store the new data and may transmit the new data to the PIM/memory die 1500 and the PIM die 1100 by using the memory controller 2100.

As described above, the PIM/memory die 1500 and the PIM die 1100 may share the channel CH1. Also, the command and address signals CA and the data input/output signals DQ associated with the dies 1100 and 1500 may be transmitted through the path Path_1 of the channel CH1. The path Path_1 of the channel CH1 may include the through silicon vias TSVs and the micro bumps BPs that pass through the PIM/memory die 1500, the PIM die 1100, and the buffer die 1900. The system processor 2200 may execute system processing by using the memory controller 2100 that accesses the PIM/memory die 1500 through the channel CH1; the PIM/memory die 1500 may receive commands of the memory controller 2100 and may perform a data input/output with the memory controller 2100; and, the path Path_1 of the channel CH1 may be used for a transfer of the commands of the memory controller 2100 and for the data input/output between the PIM/memory die 1500 and the memory controller 2100 while the global processor GP of the PIM die 1100 executes on-die processing. The path Path_1 of the channel CH1 may not be used for on-die processing of the global processor GP.

In an embodiment, in the case where the memory device 1000 includes the PIM dies 1100 to 1800 implemented to be identical, the system processor 2200 may execute system processing by using the memory controller 2100 that accesses the PIM die 1100 through the channel CH1 and may request on-die processing of the PIM die 1500 by using the memory controller 2100. That is, locations of PIM dies where system processing and on-die processing are executed are not limited to the examples described above.

Figure 12:
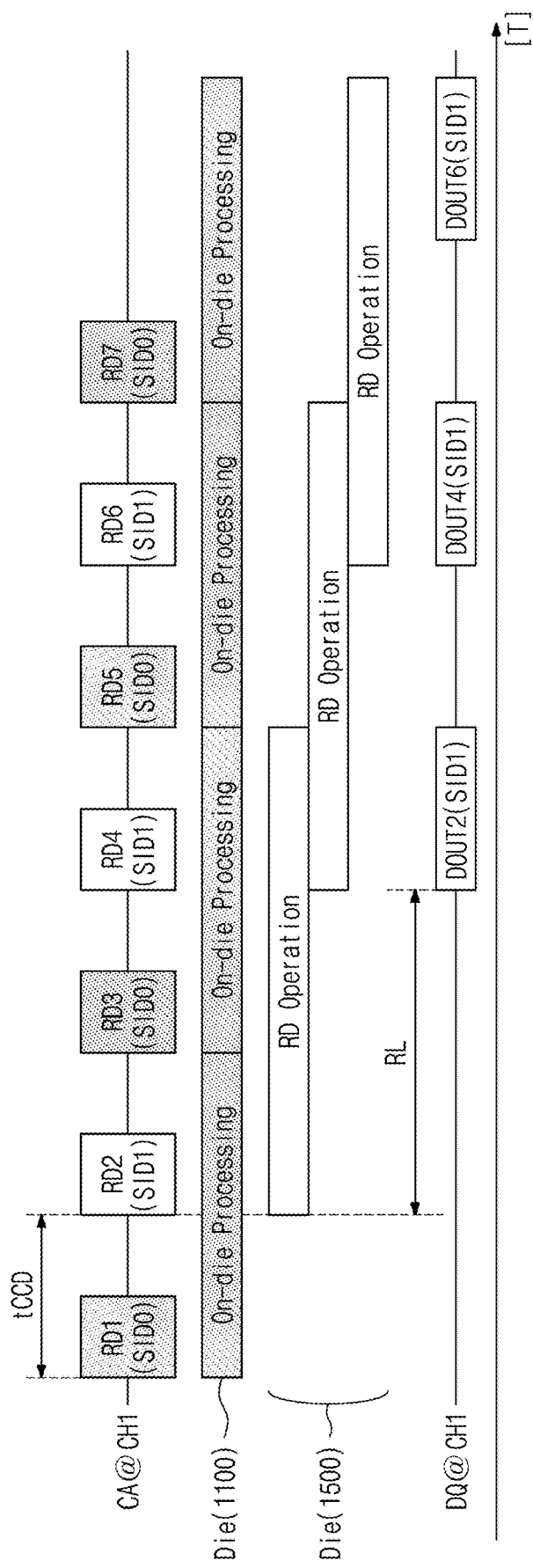
FIGS. 12 to 14 illustrate examples in which a system on chip of FIGS. 1 and 2 executes system processing and requests on-die processing of a global processor of a memory die.

FIG. 12 illustrates an example in which a system on chip of FIGS. 1 and 2 executes system processing and requests on-die processing of a global processor of a memory die. For example, a timing diagram of FIG. 12 may be a portion of the interval from T1 to T2 and the interval from T3 to T4.

Depending on a memory request of the system processor 2200, the memory controller 2100 may transmit a plurality of read commands RD1 to RD7 to the memory device 1000 through the channel CH1. The read command RD1, RD3, RD5, and RD7 may be associated with the PIM die 1100 having the stack identifier SID0, and the read commands RD2, RD4, and RD6 may be associated with the PIM/memory die 1500 having the stack identifier SID1. An interval between read commands RD1 to RD7 may be, but is not limited to, a column address strobe (CAS) to CAS latency tCCD defined in the standard (e.g., the JEDEC (Joint Electron Device Engineering Council) standard) of the memory device 1000. The number of read commands RD1 to RD7 is not limited to the example illustrated in FIG. 12.

The command and address decoder CADEC of the PIM die 1100 may check the stack identifier SID0 and may validly decode only the read command RD1, RD3, RD5, and RD7 among the read commands RD1 to RD7. The global processor GP of the PIM die 1100 may execute global calculations based on decoding results of the read command RD1, RD3, RD5, and RD7.

The command and address decoder CADEC of the PIM die 1500 may check the stack identifier SID1 and may validly decode only the read command RD2, RD4, and RD6 among the read commands RD1 to RD7. The command and address decoder CADEC of the PIM die 1500 may control any other components (e.g., at least a part of BG0, BG1, BG2, BG3, DB0, DB1, BCTRL0, BCTRL1, and DATAIO) based on a decoding result. The data input/output circuit DATAIO may receive read data requested by the read commands RD2, RD4, and RD6 through the data buses DB0 and DB1 and may output the data input/output signals DQ including the read data to the channel CH1 (DOUT2, DOUT4, and DOUT6). That is, the PIM die 1500 may perform read operations in response to the read commands RD2, RD4, and RD6 and may output the data input/output signals DQ to the channel CH1. For example, an interval between a time at which the PIM die 1500 receives the read command RD2 and a time at which the PIM die 1500 outputs the data input/output signals DQ to the channel CH1 may be a read latency RL.

An example is illustrated in FIG. 12 as the memory controller 2100 may generate the plurality of read commands RD1 to RD7 depending on a memory request of the system processor 2200. For another example, the memory controller 2100 may generate not a read command but any other command associated with a memory cell (e.g., an activation command, a write command, or a precharge command), the command and address decoder CADEC of the PIM die 1100 may decode the other command, and the global processor GP of the PIM die 1100 may execute on-die processing based on a decoding result of the other command. The command and address decoder CADEC of the PIM die 1500 may decode the other command. The PIM die 1500 may perform any other operations in response to the other command.

Figure 13:
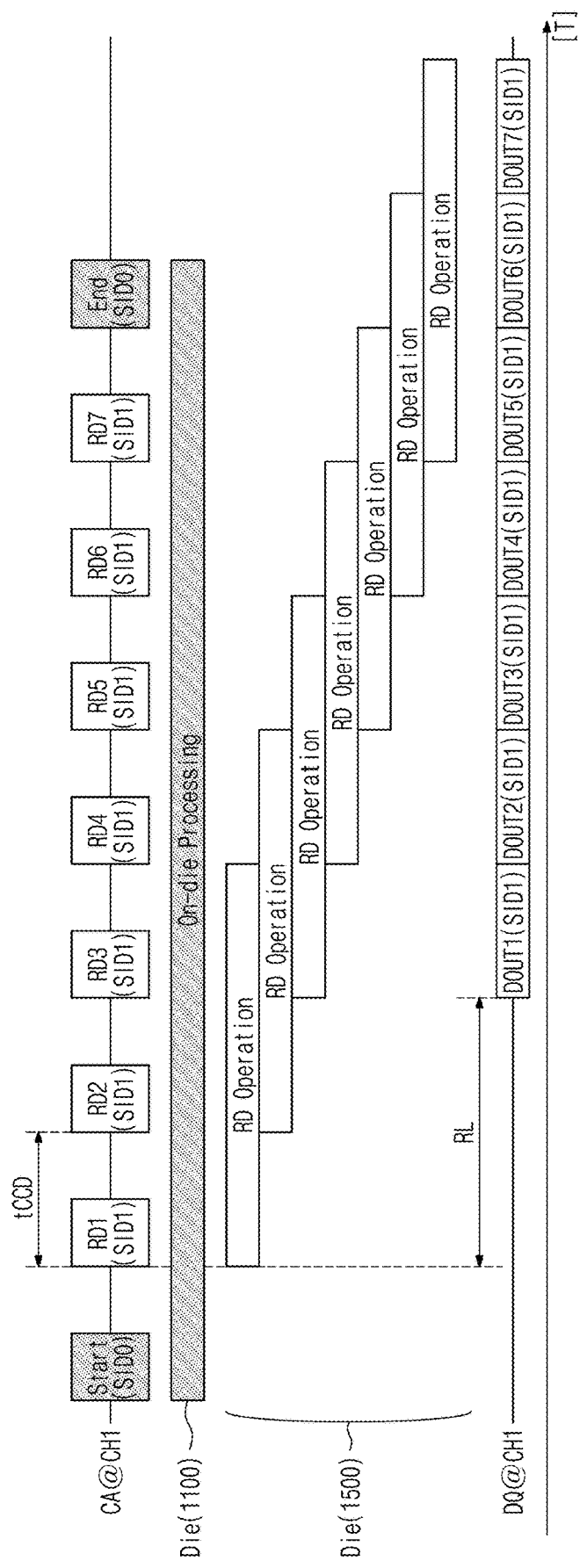

FIG. 13 illustrates another example in which a system on chip of FIGS. 1 and 2 executes system processing and requests on-die processing of a global processor of a memory die. A difference between the timing diagram FIG. 13 and the timing diagram of FIG. 12 will be mainly described. Depending on a memory request of the system processor 2200, the memory controller 2100 may transmit an execution commands for requesting an execution start and an execution end of on-die processing of the global processor GP of the PIM die 1100. The commands for requesting the execution start and the execution end of the on-die processing may have the stack identifier SID0. For example, each of the commands for requesting the execution start and the execution end of the on-die processing may be the activation command, the read command, the write command, the precharge command, etc. associated with the memory cell described above. For another example, each of the commands for requesting the execution start and the execution end of the on-die processing may be not a command associated with a memory cell but a dedicated command for accessing the control register of the processor controller 1001a/1001b and the program buffer 1002 of the global processor GPa/GPb. Depending on a memory request of the system processor 2200, the memory controller 2100 may transmit the consecutive read commands RD1 to RD7 to the memory device 1000 through the channel CH1. Each of the plurality of read commands RD1 to RD7 may have the stack identifier SID1.

The command and address decoder CADEC of the PIM die 1100 may check the stack identifier SID1 and may validly decode the commands for requesting the execution start and the execution end of the on-die processing. The global processor GP of the PIM die 1100 may start and end a global calculation based on a decoding result of the commands for requesting the execution start and the execution end of the on-die processing. The PIM die 1500 may perform read operations in response to the read commands RD1 to RD7 and may output the data input/output signals DQ to the channel CH1 (DOUT1 to DOUT7).

An example is illustrated in FIG. 12 as the memory controller 2100 alternately issues the command for requesting the execution start of the on-die processing of the global processor GP of the PIM die 1100 and the read command for requesting data of the PIM die 1500 at an interval of tCCD. The data input/output signals DQ including read data are not output from the memory device 1000 by the command for requesting the execution start of the on-die processing of the global processor GP of the PIM die 1100, and the data input/output signals DQ including data are output by the read command for requesting data of the PIM die 1500. As such, the memory controller 2100 receives the data input/output signals DQ including the read data from the memory device 1000 in a non-seamless manner. In contrast, an example is illustrated in FIG. 13 as the memory controller 2100 transmits the command for requesting the execution start of the on-die processing of the global processor GP of the PIM die 1100 to the memory device 1000 and then transmits the consecutive read commands RD1 to RD7 for requesting data of the PIM die 1500 at an interval of tCCD. Accordingly, the memory controller 2100 may receive the data input/output signals DQ including the read data from the memory device 1000 in a seamless manner. In FIG. 12, the memory controller 2100 may fail to fully utilize the bandwidth of the channel CH1 (i.e., utilize half the maximum bandwidth of the channel CH1); however, in FIG. 13, the memory controller 2100 may fully utilize the bandwidth of the channel CH1.

Figure 14:
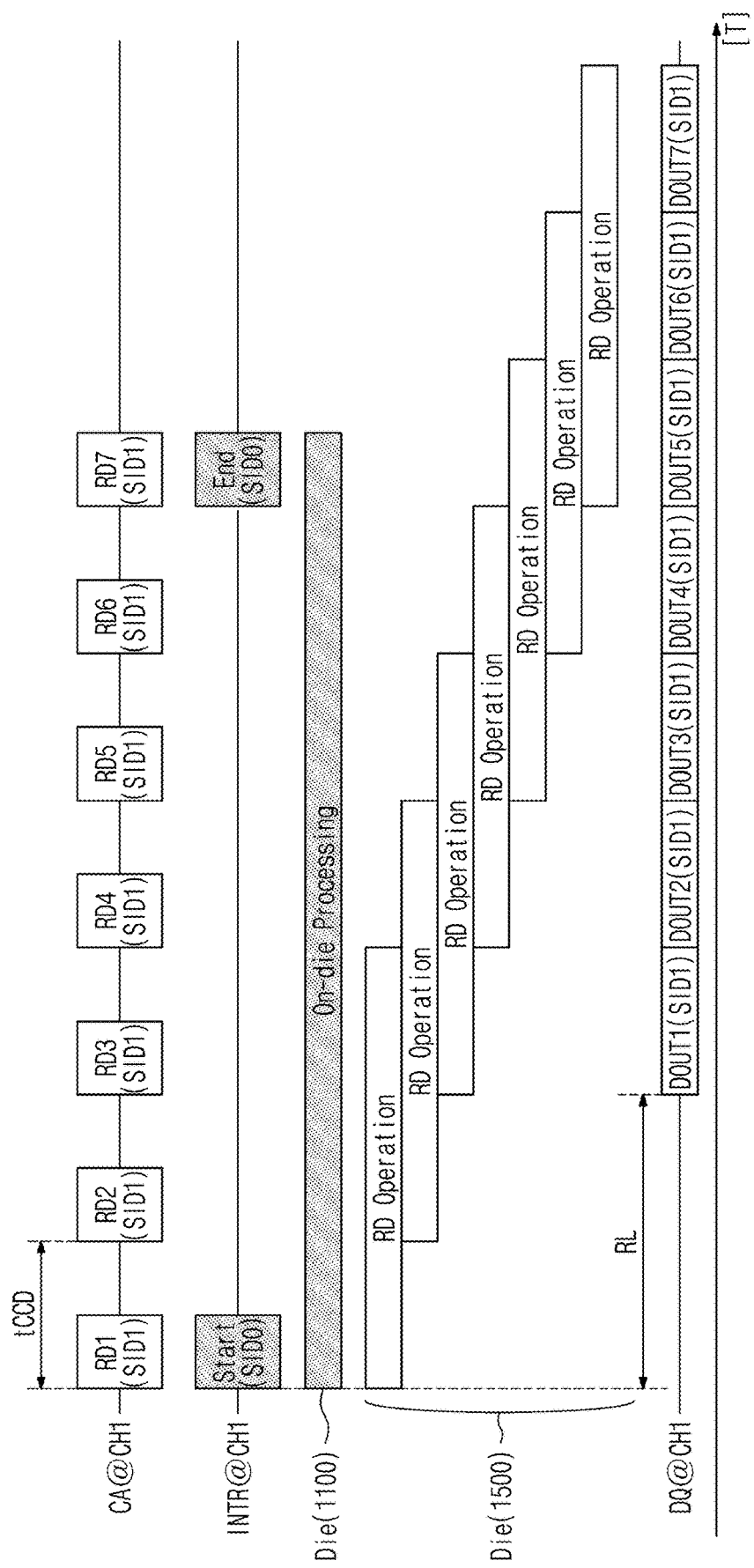

FIG. 14 illustrates another example in which a system on chip of FIGS. 1 and 2 executes system processing and requests on-die processing of a global processor of a memory die. A difference between the timing diagram FIG. 14 and the timing diagram of FIG. 13 will be mainly described. In FIG. 13, the memory controller 2100 transmits the command for requesting the execution start of the on-die processing of the global processor GP of the PIM die 1100 to the memory device 1000 and then transmits the consecutive read commands RD1 to RD7 for requesting data of the PIM die 1500 at an interval of tCCD. In the case where the PIM die 1100 includes the global processor GPa and the interrupt input/output circuit 1010 of FIG. 8, the memory controller 2100 may generate an interrupt signal for requesting the execution start of the on-die processing of the global processor GP of the PIM die 1100. The global processor GPb may execute the on-die processing in response to the interrupt signal for requesting the execution start of the on-die processing. When the on-die processing is completed (or is terminated), the global processor GPb may generate an interrupt signal indicating the execution end of the on-die processing. The above interrupt signals may be transmitted between the memory controller 2100 and the memory device 1000.

Figure 15:
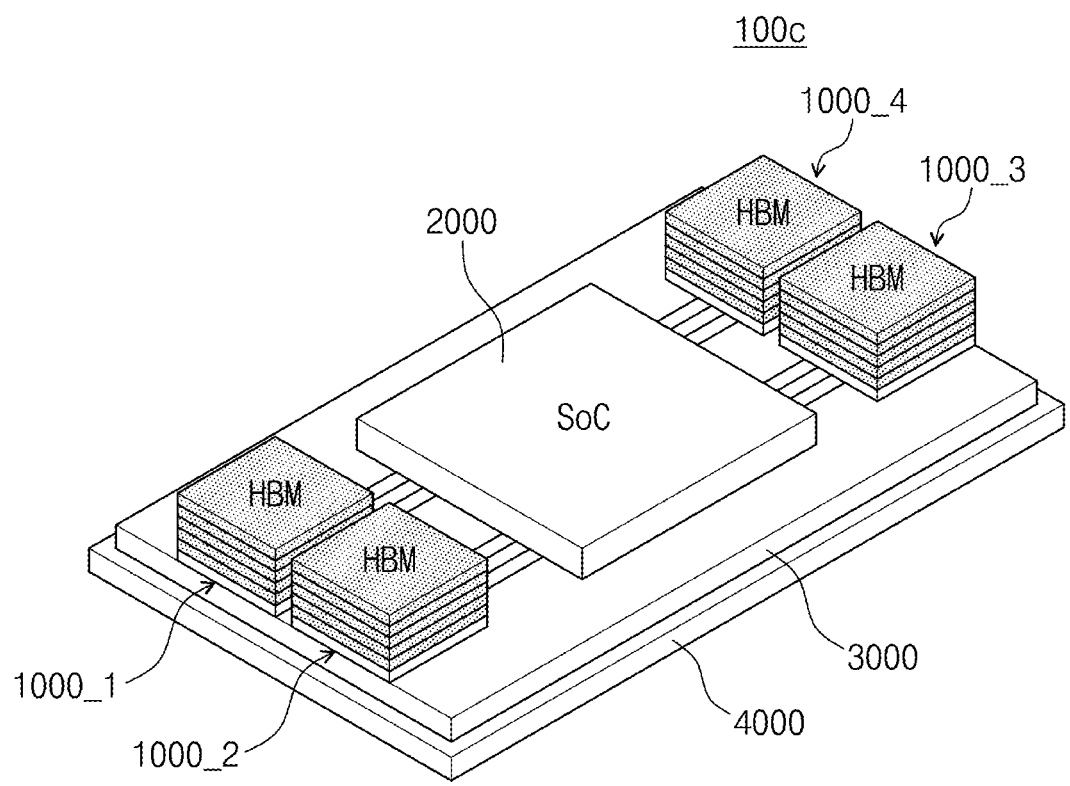
FIG. 15 illustrates an electronic device according to an embodiment.

FIG. 15 illustrates an electronic device according to another embodiment. An electronic device 100c may include memory devices 1000_1 to 1000_4 (1000_1, 1000.2, 1000_3, 1000_4), the system on chip 2000, the interposer 3000, and a package board 4000. Each of the memory devices 1000_1 to 1000_4 may correspond to the memory device 1000 described above, and the number of memory devices 1000_1 to 1000_4 is not limited to the example illustrated in FIG. 15. The interposer 3000 may include paths of a plurality of channels that allow the system on chip 2000 to access the memory devices 1000_1 to 1000_4. The interposer 3000 may be stacked on the package board 4000. However, embodiments are not limited thereto. For example, the memory devices 1000_1 to 1000_4 and the system on chip 2000 may be sacked on the package board 4000 without the interposer 3000.

A memory die of a memory device according to an embodiment may include both local processors and a global processor. Accordingly, a memory controller may fully utilize a bandwidth of a channel associated with the memory device.

While the disclosure has been described with reference to exemplary embodiments thereof, it will be apparent to those of ordinary skill in the art that various changes and modifications may be made thereto without departing from the spirit and scope of the disclosure as set forth in the following claims.

What is claimed is:

1. A memory die comprising:
    a first bank comprising first memory cells;
    a second bank comprising second memory cells;
    a first local processor connected to first bank local input/output lines through which first local bank data of the first bank are transmitted, the first local processor configured to execute a first local calculation on the first local bank data;
    a second local processor connected to second bank local input/output lines through which second local bank data of the second bank are transmitted, the second local processor configured to execute a second local calculation on the second local bank data; and
    a global processor configured to:
        control the first bank, the second bank, the first local processor, and the second local processor, and
        execute a global calculation on a first local calculation result of the first local calculation and a second local calculation result of the second local calculation,
    wherein the global processor comprises:
        a program buffer configured to store a program of a host;
        an instruction queue configured to store instructions of the program;
        an instruction decoder configured to decode the instructions stored in the instruction queue;
        a first controller configured to control the first and second banks and the first and second local processors based on a result of decoding, at the instruction decoder, the instructions;
        a global processing element (GPE) array configured to execute the global calculation based on the result of decoding, at the instruction decoder, the instructions;
        a global register configured to store a global calculation result of the global calculation;
        a data buffer configured to receive the first local calculation result and the second local calculation result through a data bus, to provide the first local calculation result and the second local calculation result to the GPE array, and to output the global calculation result to the data bus; and
        a second controller configured to control the program buffer, the instruction queue, the instruction decoder, the first controller, the GPE array, the global register, and the data buffer.

2. The memory die of claim 1, wherein the first local processor comprises:
    an input multiplexer configured to:
        receive the first local bank data through the first bank local input/output lines,
        receive broadcast data broadcasted by the global processor through bank global input/output lines, and
        receive local register data;
    a local processing element (LPE) array configured to execute the first local calculation on at least one of the first local bank data, the broadcast data, and the local register data;
    a local register configured to store the first local calculation result of the first local calculation and to output the first local calculation result as the local register data; and
    an output multiplexer configured to output the local register data to at least one of the first bank local input/output lines, the bank global input/output lines, and the input multiplexer.

3. The memory die of claim 2, further comprising:
    a bank global input/output gating circuit configured to electrically connect the first bank local input/output lines to the bank global input/output lines under control of the global processor.

4. The memory die of claim 3, further comprising:
    an input/output sense amplifier configured to receive the first local bank data output from the first bank and to output the first local bank data to the first bank local input/output lines;
    a write driver configured to write the first local bank data in the first memory cells; and
    a bank local input/output gating circuit configured to electrically connect the write driver to the first bank local input/output lines.

5. The memory die of claim 1, wherein the first memory cells, the second memory cells, the program buffer, and a control register of the second controller are mapped onto memory addresses associated with the memory die, respectively.

6. The memory die of claim 1, wherein the global processor is further configured to:
    execute on-die processing by requesting data inputs/outputs of the first and second banks or the first and second local calculations or by executing the global calculation in response to a start interrupt signal transmitted from the host; and transmit an end interrupt signal to the host when the on-die processing is completely executed.

7. The memory die of claim 1, wherein the first controller is configured to:
process a bit of a bank address, which is used to identify the first and second banks, as a Don't Care bit and simultaneously control the first and second banks.

8. A memory device comprising:
a first memory die comprising first banks accessible through a channel, wherein the first memory die is configured to:
receive commands for the first banks from a host through the channel, and
perform a data input/output with the host through the channel based on the commands; and
a second memory die comprising:
second banks accessible through the channel,
local processors configured to execute local calculations on data of the second banks, respectively, and
a global processor configured to:
control the second banks and the local processors, and
execute a global calculation on local calculation results of the local calculations,
wherein the first banks, the second banks, a control register of the global processor, and a program buffer of the global processor, which stores a program of the host, are mapped onto memory addresses associated with the memory device, respectively.

9. The memory device of claim 8, wherein the global processor is further configured to:
execute on-die processing by:
requesting data inputs/outputs of the second banks or the local calculations, or
executing the global calculation in response to a start interrupt signal transmitted from the host; and
transmit an end interrupt signal to the host when the on-die processing is completely executed.

10. The memory device of claim 9, further comprising:
a buffer die,
wherein the first memory die and the second memory die are stacked on the buffer die, and
wherein paths of the channel comprise a plurality of Through Silicon Vias (TSVs) passing through the buffer die, the first memory die, and the second memory die, respectively.

11. The memory device of claim 10, wherein, while the first memory die receives the commands and performs the data input/output and the global processor of the second memory die executes the on-die processing, the paths of the channel are used for a transfer of the commands for the first banks and for the data input/output with the host.

12. The memory device of claim 8, wherein the first memory die is implemented to be identical to the second memory die,
wherein the first memory die further comprises:
first local processors configured to execute first local calculations on data of the first banks, respectively; and
a first global processor configured to:
control the first banks and the first local processors, and
execute a first global calculation on local calculation results of the first local calculations, and
wherein the local calculations are second local calculations, the local processors are second local processors, and the global calculation is a second global calculation.

13. The memory device of claim 12, wherein the first global processor is further configured to:
execute on-die processing by:
requesting data inputs/outputs of the first banks or the local calculations, or
executing the local calculations in response to a start interrupt signal transmitted from the host; and
transmit an end interrupt signal to the host when the on-die processing is completely executed.

14. The memory device of claim 8, wherein the first memory die is implemented to be different from the second memory die.

15. An electronic device comprising:
a memory device comprising a first memory die, a second memory die and a buffer die, wherein the first and second memory dies are stacked on the buffer die,
wherein the first memory die comprises first banks, and
wherein the second memory die comprises:
second banks, local processors configured to execute local calculations on data of the second banks, respectively, and
a global processor configured to:
control the second banks and the local processors, and
execute a global calculation on local calculation results of the local calculations; and
a system on chip comprising a memory controller configured to access one of the first memory die and the second memory die through a channel,
wherein the system on chip further comprises: a system processor configured to execute system processing by using the memory controller which accesses the first banks of the first memory die through the channel, and
wherein the global processor of the second memory die is configured to execute on-die processing by:
requesting data inputs/outputs of the second banks or the local calculations, or
executing the global calculation, while the system processor executes the system processing,
wherein paths of the channel comprises a plurality of Through Silicon Vias (TSVs) passing through the buffer die, the first memory die, and the second memory die, respectively.

16. The electronic device of claim 15, wherein the system processing is image processing, and the on-die processing is speech recognition processing.

* * * * *